United States Patent
Song et al.

(10) Patent No.: US 9,854,678 B2
(45) Date of Patent: Dec. 26, 2017

(54) ELECTRONIC DEVICE INCLUDING CABLE SUPPORTING STRUCTURE

(71) Applicants: Samsung Electronics Co., Ltd., Gyeonggi-do (KR); POCONS CO., LTD., Gyeonggi-do (KR)

(72) Inventors: Byoung-ryoul Song, Gyeonggi-do (KR); Eui-suck Sung, Gyeongsangbuk-do (KR)

(73) Assignees: Samsung Electronics Co., Ltd (KR); Pocons Co., Ltd (KR)

( * ) Notice: Subject to any disclaimer, the term of this patent is extended or adjusted under 35 U.S.C. 154(b) by 0 days.

(21) Appl. No.: 15/366,595

(22) Filed: Dec. 1, 2016

(65) Prior Publication Data
US 2017/0164498 A1  Jun. 8, 2017

(30) Foreign Application Priority Data
Dec. 7, 2015  (KR) .................. 10-2015-0173304

(51) Int. Cl.
*H05K 7/00* (2006.01)
*H05K 1/18* (2006.01)
(Continued)

(52) U.S. Cl.
CPC .............. *H05K 1/181* (2013.01); *H01R 4/48* (2013.01); *H01R 13/6594* (2013.01);
(Continued)

(58) Field of Classification Search
USPC ................................ 361/783, 760, 717, 764
See application file for complete search history.

(56) References Cited

U.S. PATENT DOCUMENTS 8,179,678 B2 *  5/2012  Yamashita ............ H01L 23/552
                                                          257/712
8,192,209 B1   6/2012  Li et al.
(Continued)

FOREIGN PATENT DOCUMENTS

GB        2 396 748       6/2004
KR       10-0616917       8/2006

OTHER PUBLICATIONS

European Search Report dated Jun. 26, 2017 issued in counterpart application No. 16199054.4-1806, 10 pages.

*Primary Examiner* — Andargie M Aychillhum
(74) *Attorney, Agent, or Firm* — The Farrell Law Firm, P.C.

(57) ABSTRACT

An electronic device is provided which includes a printed circuit board (PCB) including a non-conductive layer that forms at least a portion of a first surface, and a conductive layer arranged between the first surface and a second surface, an electronic component arranged on a first area of the first surface of the PCB, a conductive shield structure arranged on the PCB to cover the first area and the electronic component on the PCB, a support structure connected to the PCB and including a first part that faces a portion of one side of the conductive shield structure, and a cable extending along the one side of the conductive shield structure, inserted between the support structure and the portion of the one side of the conductive shield structure, and including at least one conductive line and an insulation layer that covers the at least one conductive line.

22 Claims, 19 Drawing Sheets

(51) Int. Cl.
*H05K 3/32* (2006.01)
*H05K 9/00* (2006.01)
*H01R 4/48* (2006.01)
*H01R 13/6594* (2011.01)
*H05K 1/02* (2006.01)
*H05K 3/40* (2006.01)

(52) U.S. Cl.
CPC ........... *H05K 3/325* (2013.01); *H05K 9/0032* (2013.01); *H05K 1/0215* (2013.01); *H05K 3/4015* (2013.01); *H05K 2201/10189* (2013.01); *H05K 2201/10356* (2013.01); *H05K 2201/10371* (2013.01); *H05K 2201/10393* (2013.01)

(56) References Cited

U.S. PATENT DOCUMENTS

| | | |
|---|---|---|
| 8,576,569 B2 | 11/2013 | Malek et al. |
| 8,681,056 B2 * | 3/2014 | Hobson ................ H01Q 1/243 |
| | | 343/702 |
| 2004/0155724 A1 | 8/2004 | Whybrew et al. |
| 2012/0176755 A1 | 7/2012 | Malek et al. |
| 2013/0048368 A1 | 2/2013 | Malek et al. |

\* cited by examiner

US 9,854,678 B2

ELECTRONIC DEVICE INCLUDING CABLE SUPPORTING STRUCTURE

PRIORITY

This application claims priority under 35 U.S.C. 119(a) to Korean Patent Application Serial No. 10-2015-0173304, which was filed on Dec. 7, 2015, in the Korean Intellectual Property Office, the entire disclosure of which is incorporated herein by reference.

BACKGROUND

1. Field of the Disclosure

The present disclosure generally relates to an electronic device including a structure that supports a cable on a printed circuit board (PCB).

2. Description of the Related Art

A plurality of electric contact units that are separated from one another may be provided on a printed circuit board (PCB) of an electronic device. The electric contact units may be connected to each other by a conductive pattern on the PCB. In this case, degrees of freedom with respect to installation of a signal line for electrical connection of a plurality of electronic components mounted on the PCB may be degraded due to the conductive pattern. Therefore, the separated electric contact units may be connected to one another via a cable.

For example, various sorts of antennas are required for mobile devices, and the antennas may be electrically connected to each other via a cable. In this case, a clip for fixing the cable to the PCB and supporting the cable may be used. The clip may be mounted on the PCB.

As electronic devices become more compact, printed circuit boards (PCBs) accommodated within the electronic devices are becoming compact and integrated. To mount a clip on a PCB, a substantial mounting area in which not only a mounting area of the clip but also distances between the clip and peripheral components are reflected is necessary, and thus it is difficult to apply the clip to such a compact PCB.

SUMMARY

An aspect of the present disclosure provides supporting structures capable of reducing a mounting space for a clip for supporting a cable.

According to an aspect of the present disclosure, an electronic device is provided which includes a housing, a printed circuit board (PCB) included in the housing, and including a first surface, a second surface on a side of the PCB opposite to the first surface, a lateral surface, a non-conductive layer that is at least a portion of the first surface, and a conductive layer arranged between the first surface and the second surface, an electronic component arranged on a first area of the first surface of the PCB, a conductive shield structure arranged on the PCB to cover the first area and the electronic component on the PCB, as viewed from above the first surface of the PCB, a support structure connected to the PCB, and including a first part that extends substantially perpendicular to the first surface and faces a portion of one side of the conductive shield structure at a certain distance as viewed from above the first surface of the PCB, and a cable extending along the one side of the conductive shield structure as viewed from above the first surface of the PCB, inserted between the support structure and the portion of the one side of the conductive shield structure, and including at least one conductive line and an insulation layer that covers the at least one conductive line.

BRIEF DESCRIPTION OF THE DRAWINGS

These and/or other aspects and features of the present disclosure will become apparent to those skilled in the art from the following detailed description when taken in conjunction with the accompanying drawings in which.

DETAILED DESCRIPTION

Figure 1:
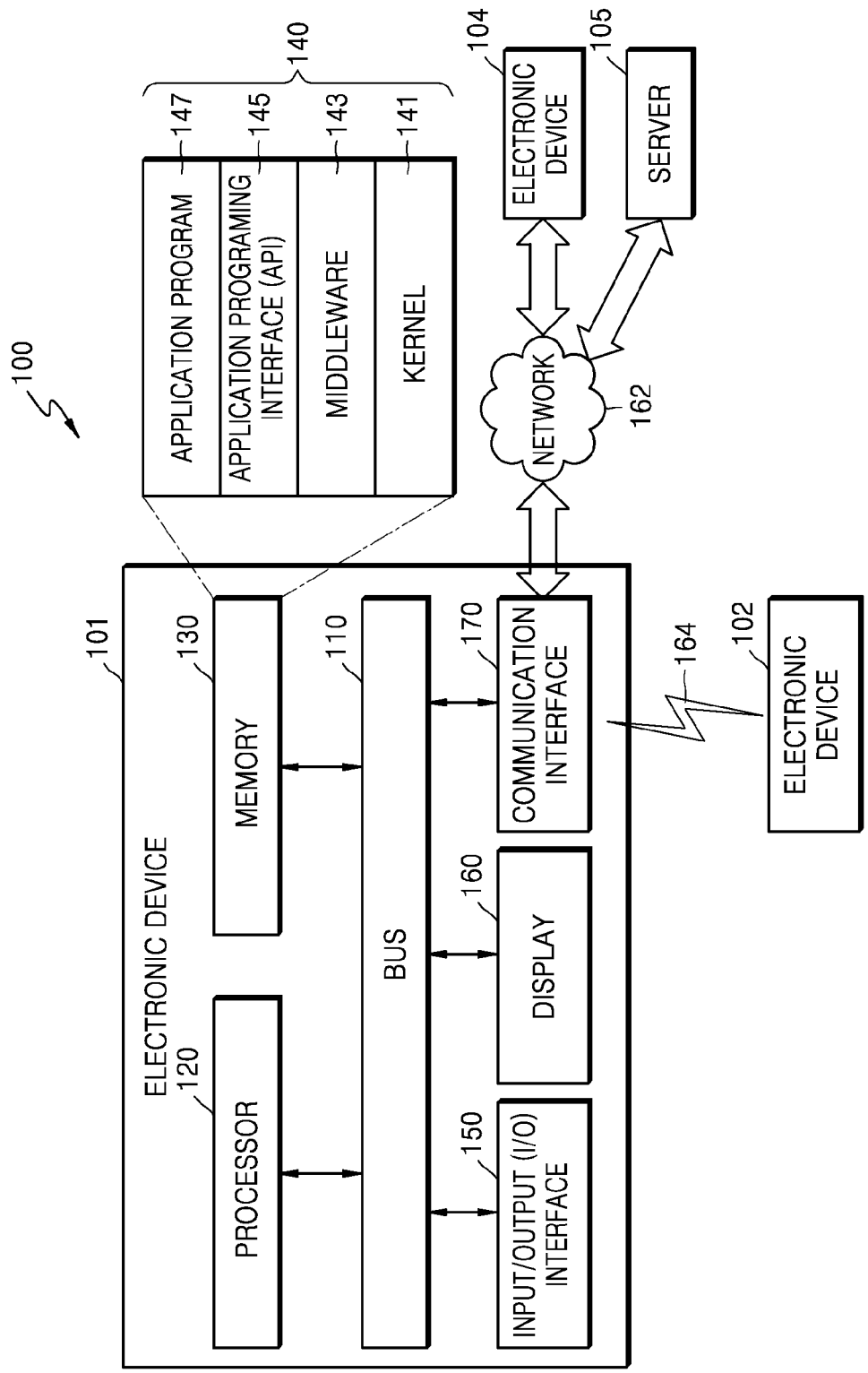
FIG. 1 is a schematic block diagram of an electronic device within a network environment, according to an embodiment of the present disclosure.

Various embodiments of the present disclosure will now be described in detail with reference to the accompanying drawings. In the following description, specific details such as detailed configuration and components are provided to assist in the overall understanding of the embodiments of the present disclosure. Therefore, it should be apparent to those skilled in the art that various changes and modifications of the embodiments described herein may be made without departing from the scope and spirit of the present disclosure. In the accompanying drawings, like reference numerals may refer to like elements.

Herein, expressions such as "having," "may have," "comprising," and "may comprise" indicate the existence of a corresponding characteristic (e.g., an element such as a numerical value, function, operation, and/or component) and do not exclude the existence of an additional characteristic.

Herein, expressions such as "A or B," "at least one of A or/and B," and "one or more of A or/and B" may include all possible combinations of together listed items. For example, these expressions may indicate (1) including at least one A, (2) including at least one B, or (3) including both at least one A and at least one B.

Expressions such as "first," "second," "primarily," and "secondary," may represent various elements regardless of order and/or importance, and do not limit corresponding elements. These expressions may be used for distinguishing one element from another element. For example, a first user device and a second user device may represent different user devices, regardless of order or importance. For example, a first element could be referred to as a second element without deviating from the scope of the present embodiments, and similarly, a second element may be referred to as a first element.

When an element (e.g., a first element) is "operatively or communicatively coupled to" or "connected to" another element (e.g., a second element), the first element may be directly connected to the second element or a third element may exist therebetween. However, when the first element is "directly connected to" or "directly coupled to" the second element, no intermediate element exists therebetween.

The expression "configured to (or set to)" may be used interchangeably with, for example, "suitable for," "having the capacity to," "designed to," "adapted to," "made to," or "capable of" according to context. Further, "configured to (or set to)" does not necessarily mean "specifically designed to" by hardware. For example, an "apparatus configured to" may indicate that the apparatus may operate with another apparatus or component. For example, "a processor configured (or set) to perform A, B, and C" may be a dedicated processor (such as an embedded processor) for performing a corresponding operation, or a general-purpose processor (such as a central processing unit (CPU) or an application processor (AP)) that may execute at least one software program stored in a memory device to perform a corresponding operation.

Terms defined herein are used for only describing a specific embodiment and do not limit the scope of other embodiments. A singular form may include a plurality of forms unless explicitly represented as such. All terms, including technical and scientific terms, used herein may have the same meanings as would be generally understood by a person of common skill in the art. Terms that are defined in a dictionary have the same or similar meanings as would be understood in the related technology and are not to be interpreted as having ideal or excessively formal meanings unless explicitly defined as such. In some cases, terms defined herein cannot be interpreted to exclude the present embodiments.

An electronic device according an embodiment of the present disclosure may include at least one of, for example, a smartphone, a tablet personal computer (PC), a mobile phone, an image phone, an e-book reader, a desktop PC, a laptop PC, a netbook computer, a workstation, a server, a personal digital assistant (PDA), a portable multimedia player (PMP), an MP3 player, a mobile medical apparatus, a camera, or a wearable device. For example, the wearable device may include at least one of an accessory type service device (e.g., a watch, a ring, a bracelet, an anklet, a necklace, eyeglasses, contact lenses, or head-mounted-device (HMD)), a fabric or clothing-integrated type device (e.g., electronic clothing), a body-attached type device (e.g., a skin pad or tattoo), or a body-implanted type device (e.g., an implantable circuit).

The electronic device may also be a smart home appliance, such as a television (TV), a digital video disk (DVD) player, audio equipment, a refrigerator, an air conditioner, a vacuum cleaner, an oven, a microwave oven, a washing machine, an air cleaner, a set-top box, a home automation control panel, a security control panel, a TV box (e.g., Samsung HomeSync®, Apple TV®, or Google TV®), a game console (e.g., Xbox® or PlayStation®), an electronic dictionary, an electronic key, a camcorder, and an electronic frame.

The electronic device may also include at least one of various medical equipment (e.g., various portable medical measurement systems, such as a blood sugar measurement device, a heartbeat measurement device, a blood pressure measurement device, or a body temperature measurement device, a magnetic resonance angiography (MRA) device, a magnetic resonance imaging (MRI) device, a computed tomography (CT) device, an imaging device, or an ultrasonic device), a navigation system, a global navigation satellite system (GNSS), an event data recorder (EDR), a flight data recorder (FDR), a vehicle infotainment device, electronic equipment for ships (e.g., navigation system and gyro compass for ships), avionics, a security device, a vehicle head unit, an industrial or home robot, an automatic teller machine (ATM), a point of sales (POS) terminal, or Internet of things (IoT) devices (e.g., light bulbs, various sensors, electricity or gas meters, sprinkler devices, fire alarm devices, thermostats, streetlights, toasters, exercise machines, hot-water tanks, heaters, boilers, etc.).

The electronic device may also include at least one of a part of a furniture or building/structure, an electronic board, an electronic signature receiving device, a projector, or various measuring instruments (e.g., a water, electricity, gas, or electric wave measuring device). The electronic device may also be a combination of the above-listed devices. The electronic device may also be a flexible electronic device.

The electronic device is not limited to the above-listed devices and may include new electronic devices according to new technical developments.

An electronic device according to an embodiment of the present disclosure will now be described with reference to the accompanying drawings. Herein, the term "user" may refer to a person who uses the electronic device or a device (e.g., an artificial intelligence electronic device) using the electronic device.

FIG. 1 illustrates an electronic device 101 in a network environment 100, according to an embodiment of the present disclosure. Referring to FIG. 1, the electronic device 101 includes a bus 110, a processor 120, a memory 130, an input/output (I/O) interface 150, a display 160, and a communication module 170. Alternatively, the electronic device 101 may omit at least one of the foregoing elements and/or may further include other elements.

The bus 110 may include a circuit for interconnecting the elements 110 through 170 and for allowing communication (e.g., a control message and/or data) between the elements 110 through 170.

The processor 120 may include one or more of a CPU, an AP, and a communication processor (CP). The processor 120 performs operations or data processing for control and/or communication of, for example, at least one other elements of the electronic device 101.

The memory 130 may include a volatile and/or nonvolatile memory. The memory 130 may store, for example, commands or data associated with at least one other elements of the electronic device 101. The memory 130 may store software and/or a program 140.

The program 140 includes a kernel 141, middleware 143, an application programming interface (API) 145, and an application program (or an application) 147. At least some of the kernel 141, the middleware 143, and the API 145 may be referred to as an operating system (OS).

The I/O interface 150 delivers a command or data input from a user or another external device to other element(s) of the electronic device 101. The I/O interface 150 may also output a command or data received from other element(s) of the electronic device 101 to a user or another external device.

The display 160 may include a liquid crystal display (LCD), a light emitting diode (LED) display, an organic light emitting diode (OLED) display, a microelectromechanical system (MEMS) display, or an electronic paper display. The display 160 may display various content (e.g., a text, an image, video, an icon, or a symbol) to users. The display 160 may also include a touch screen, which receives a touch, a gesture, proximity, and/or a hovering input, for example, from an electronic pen or a part of a body of a user.

The communication module 170 sets up communication, for example, between the electronic device 101 and a first external electronic device 102, a second external electronic device 104, and/or a server 105. The communication module 170 is connected to a network 162 through wireless or wired communication to communicate with the second external electronic device 104 and/or the server 105.

The wireless communication may use, as a cellular communication protocol, at least one of long term evolution (LTE), LTE-advanced (LTE-A), code division multiple access (CDMA), wideband CDMA (WCDMA), a universal mobile telecommunication system (UMTS), wireless broadband (WiBro), or global system for mobile communications (GSM). Wireless communication also includes short-range communication 164. The short-range communication 164 may include at least one of wireless fidelity (WiFi), Bluetooth (BT), near field communication (NFC), or global navigation satellite system (GNSS). The GNSS may include at least one of a global positioning system (GPS), a global navigation satellite system (Glonass), a Beidou navigation satellite system (Beidou), or Galileo, the European global satellite-based navigation system. Herein, the term "GPS" may be used interchangeably with the term "GNSS". The wired communication may include at least one of a universal serial bus (USB), a high definition multimedia interface (HDMI), a recommended standard (RS)-2032, or a plain old telephone service (POTS). The network 162 may include a telecommunications network, for example, at least one of a computer network (e.g., a local area network (LAN) or a wide area network (WAN)), Internet, and a telephone network.

Each of the first external electronic device 102 and the second external electronic device 104 may be the same type or a different type of device than the electronic device 101. The server 105 may include a group of one or more servers. All or some of operations performed in the electronic device 101 may be performed in the electronic device 102, the electronic device 104, and/or the server 105. For example, when the electronic device 101 has to perform a function or a service, the electronic device 101 may request the electronic devices 102 and 104, and/or the server 105 to perform at least some functions associated with the function or the service, instead of or in addition to executing the function or the service itself. The electronic devices 102 and 104 and/or the server 105 may perform the requested function or an additional function and deliver the result to the electronic device 101. The electronic device 101 provides the received result without changes, or provides the requested function or service by processing the received result. For example, cloud computing, distributed computing, or client-server computing may be used.

Figure 2:
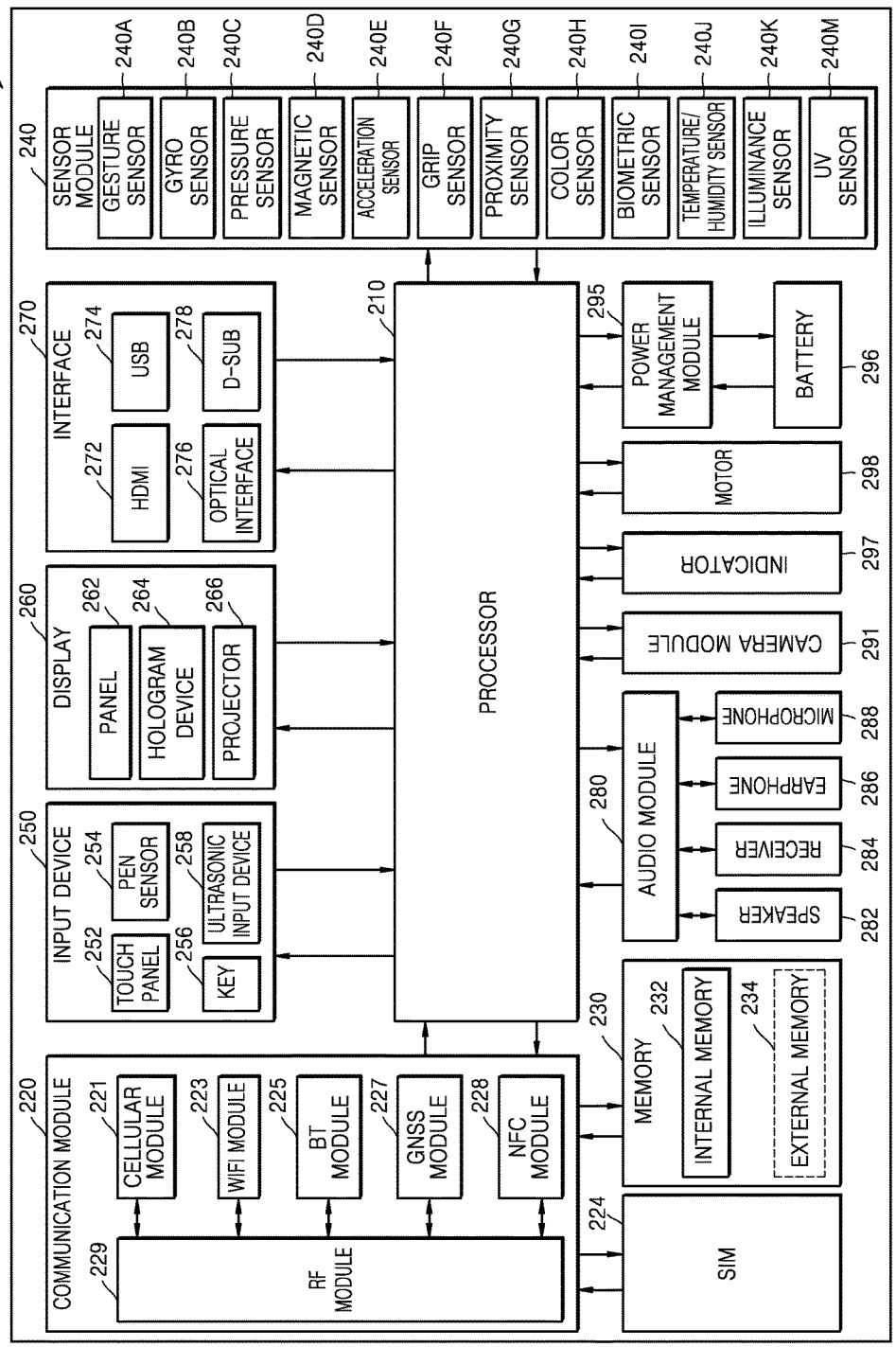
FIG. 2 is a schematic block diagram of an electronic device according to an embodiment of the present disclosure.

FIG. 2 is a block diagram of an electronic device 201 according to an embodiment of the present disclosure. The electronic device 201 may include, for example, the whole or a portion of the electronic device 101 of FIG. 1. Referring to FIG. 2, the electronic device 201 includes a processor 210 (e.g., an AP), a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298.

The processor 210 controls multiple hardware or software components connected to the processor 210 by driving an OS or an application program, and performs a variety of data processing and operations. The processor 210 may be implemented using a system on chip (SoC). The processor 210 may further include a graphic processing unit (GPU) and/or an image signal processor. The processor 210 may also include at least some (e.g., a cellular module 221) of the elements illustrated in FIG. 2. The processor 210 loads a command or data received from at least one of other elements (e.g., a non-volatile memory) into a volatile memory and processes the command or data and stores various data in the non-volatile memory.

The communication module 220 may have a configuration that is the same as or similar to the communication module 170 illustrated in FIG. 1. The communication module 220 includes the cellular module 221, a WiFi module 223, a BT module 225, a GNSS module (e.g., a GPS module, a Glonass module, a Beidou module, or a Galileo module) 227, an NFC module 228, and a radio frequency (RF) module 229.

The memory 230 (e.g., the memory 130) includes an internal memory 232 or an external memory 234. The internal memory 232 may include at least one of a volatile memory (e.g., dynamic random access memory (DRAM), static RAM (SRAM), or synchronous dynamic RAM (SDRAM)), and a non-volatile memory (e.g., one time programmable read only memory (OTPROM), programmable ROM (PROM), erasable and programmable ROM (EPROM), electrically erasable and programmable ROM (EEPROM), mask ROM, flash ROM, NAND flash memory, NOR flash memory, a hard drive, or a solid state drive (SSD)).

The external memory 234 may further include a flash drive (e.g., a compact flash (CF), a secure digital (SD), a micro-SD, a mini-SD, an extreme digital (xD), a multimedia card (MMC), or a memory stick). The external memory 234 may be functionally and/or physically connected with the electronic device 201 through various interfaces.

The sensor module 240 measures physical quantity or senses an operation state of the electronic device 201 to convert the measured or sensed information into an electric signal. The sensor module 240 includes at least one of a gesture sensor 240A, a gyro sensor 240B, a pressure sensor 240C, a magnetic sensor 240D, an acceleration sensor 240E, a grip sensor 240F, a proximity sensor 240G, a color sensor 240H (e.g., RGB sensor), a biometric sensor 240I, a temperature/humidity sensor 240J, an illumination sensor 240K, and an ultraviolet (UV) sensor 240M. The sensor module 240 may further include a control circuit for controlling at least one sensor included therein. Alternatively, the electronic device 201 may also include a processor configured to control the sensor module 240 as part of or separately from the processor 210, to control the sensor module 240 during a sleep state of the processor 210.

The input device 250 includes a touch panel 252, a (digital) pen sensor 254, a key 256, and an ultrasonic input device 258. The touch panel 252 may use at least one of a capacitive type, a resistive type, an infrared (IR) type, or an ultrasonic type. The touch panel 252 may further include a control circuit. The touch panel 252 may further include a tactile layer to provide tactile reaction to the user.

The (digital) pen sensor 254 may include a recognition sheet which is a part of the touch panel 252 or a separate recognition sheet. The key 256 may also include a physical button, an optical key, or a keypad. The ultrasonic input device 258 senses ultrasonic waves generated in an input means for generating the ultrasonic waves through a microphone 288 and checks data corresponding to the sensed ultrasonic waves in the electronic device 201.

The display 260 (e.g., the display 160) includes a panel 262, a hologram device 264, and a projector 266. The panel 262 may have a configuration that is the same as or similar to the display 160 illustrated in FIG. 1. The panel 262 may be implemented to be flexible, transparent, and/or wearable. The panel 262 may be configured with the touch panel 252 in one module.

The interface 270 includes a high-definition multimedia interface (HDMI) 272, a universal serial bus (USB) 274, an optical interface 276, and a D-subminiature 278.

The audio module 280 bi-directionally converts sound and an electric signal. At least some of the elements of the audio module 280 may be included in the I/O interface 150 illustrated in FIG. 1. The audio module 280 processes sound information that is input or output through a speaker 282, a receiver 284, an earphone 286, and/or the microphone 288.

The camera module 291 captures a still image or a moving image, and may include one or more image sensors (e.g., a front sensor or a rear sensor), a lens, an image signal processor (ISP), or a flash (e.g., an LED or a xenon lamp).

The power management module 295 manages power of the electronic device 201. The power management module 295 may include a power management integrated circuit (PMIC), a charger IC, and/or a battery gauge. The PMIC may have a wired and/or wireless charging scheme. The battery gauge measures the remaining capacity of the battery 296 or the voltage, current, or temperature of the battery 296 during charging.

The indicator 297 displays a particular state, for example, a booting state, a message state, or a charging state, of the electronic device 201 or a part (e.g., the processor 210) thereof. The motor 298 converts an electric signal into mechanical vibration or generates vibration or a haptic effect.

Each of the foregoing elements described herein may include one or more components, and a name of the component may vary with a type of the electronic device 201. Alternatively, the electronic device 201 may include at least one of the foregoing elements, and some of the elements may be omitted therefrom or other elements may be further included therein. As some of the elements of the electronic device 201 are coupled into one entity, the same function as those of the elements that have not been coupled may be performed.

Figure 3:
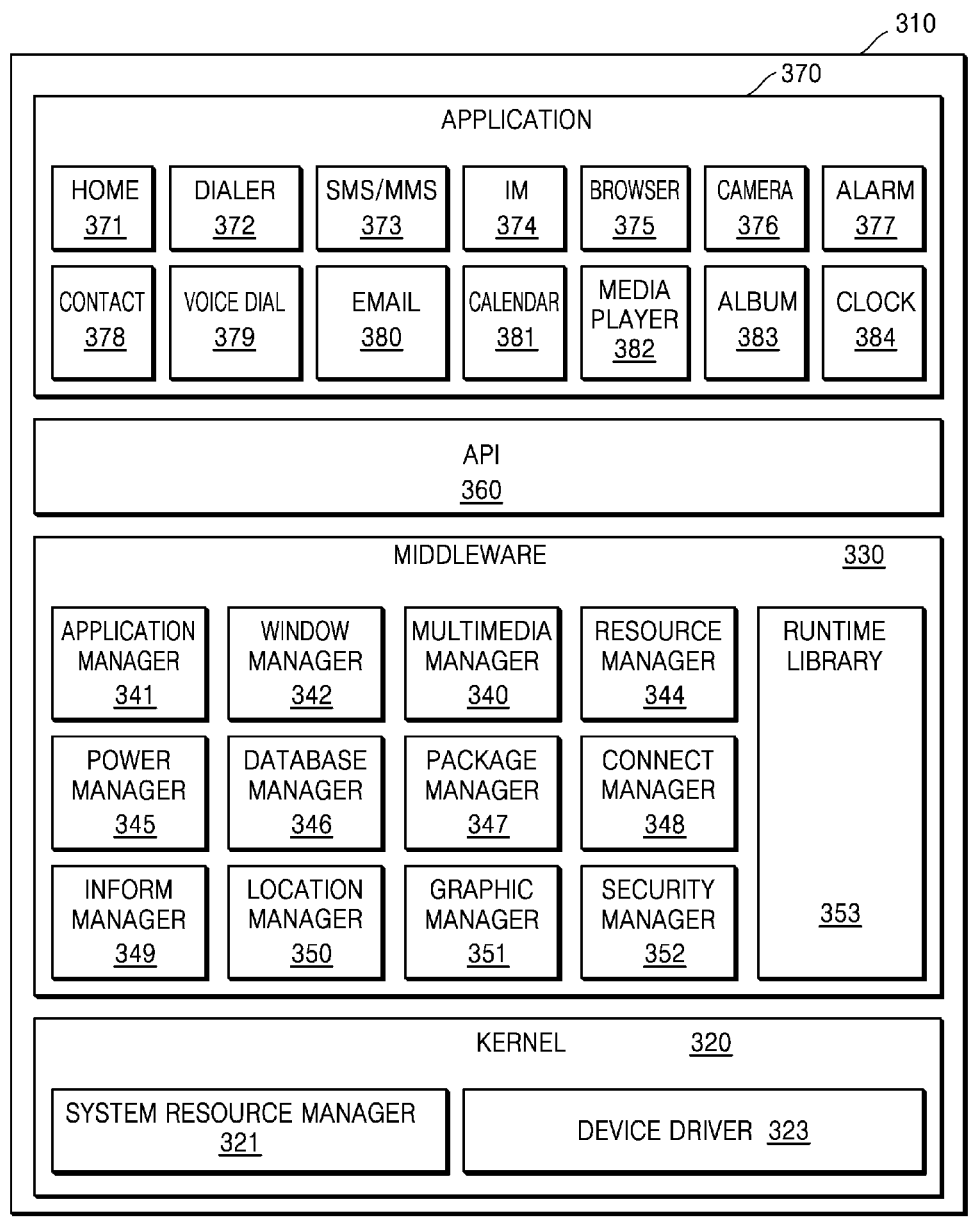
FIG. 3 is a schematic block diagram of a programming module according to an embodiment of the present disclosure.

FIG. 3 is a block diagram of a programming module 310 according to an embodiment of the present disclosure. Referring to FIG. 3, the programming module 310 (e.g., the program 140 in FIG. 1) may include an OS for controlling resources associated with an electronic device (e.g., the electronic device 101 in FIG. 1) and/or various applications (e.g., the application program 147 in FIG. 1) executed on the OS. The OS may be Android®, iOS®, Windows®, Symbian®, Tizen®, or Bada.

The programming module 310 includes a kernel 320, middleware 330, an API 360, and applications 370. At least a part of the programming module 310 may be preloaded on an electronic device or may be downloaded from the electronic device 102 or 104, or the server 105.

The kernel 320 includes a system resource manager 321 and/or a device driver 323. The system resource manager 321 may perform control, allocation, or retrieval of system resources. The system resource manager 321 may include a process management unit, a memory management unit, or a file system management unit. The device driver 323 may include a display driver, a camera driver, a Bluetooth driver, a shared memory driver, a USB driver, a keypad driver, a WiFi driver, an audio driver, and/or an inter-process communication (IPC) driver.

The middleware 330 may provide functions that the applications 370 commonly require or provide various functions to the applications 370 through the API 360 to allow the applications 370 to efficiently use a limited system resource in an electronic device. The middleware 330 (e.g., the middleware 143) includes at least one of a runtime library 353, an application manager 341, a window manager 342, a multimedia manager 343, a resource manager 344, a power manager 345, a database manager 346, a package manager 347, a connectivity (or connect) manager 348, a notification (or inform) manager 349, a location manager 350, a graphic manager 351, or a security manager 352.

The middleware 330 may also include a middleware module forming a combination of various functions of the above-mentioned internal elements. The middleware 330 may provide modules specified according to types of OS so as to provide distinctive functions. Additionally, the middleware 330 may delete some of existing elements or add new elements dynamically.

The API 360 (e.g., the API 145) may be provided as a set of API programming functions with a different configuration according to the OS. In the case of Android® or iOS®, for example, one API set may be provided by each platform, and in the case of Tizen®, two or more API sets may be provided.

The applications 370 (e.g., the application program 147) include a home application 371, a dialer application 372, a short messaging service/multimedia messaging service (SMS/MMS) application 373, an instant message (IM) application 374, a browser application 375, a camera application 376, an alarm application 377, a contact application 378, a voice dial application 379, an e-mail application 380, a calendar application 381, a media player application 382, an album application 383, and a clock application 384. The applications 370 may include other applications, e.g., a health care application (e.g., an application for measuring an exercise amount or a blood sugar level), or an environment information providing application (e.g., an application for providing air pressure, humidity, or temperature information).

At least a part of the programming module 310 may be implemented by software, firmware, hardware, or a combination of at least two of them. The at least a part of the programming module 310 may be implemented (e.g., executed) by a processor (e.g., the processor 210). The at least a part of the programming module 310 may include a module, a program, a routine, sets of instructions, or a process for performing one or more functions.

At least a part of a device (for example, modules or functions thereof) or a method (for example, operations) according to an embodiment of the present disclosure may be implemented with a command stored in a computer-readable storage medium in the form of a program module. When the command is executed by a processor (for example, the processor 120), the one or more processors may perform a function corresponding to the command. The computer-readable storage medium may be, for example, the memory 130.

Modules or programming modules according to an embodiment of the present disclosure may include one or more of the foregoing elements, have some of the foregoing elements omitted, or further include additional other elements. Operations performed by the modules, the programming modules or other elements may be executed in a sequential, parallel, repetitive or heuristic manner. Also, some of the operations may be executed in different order or omitted, or may have additional different operations. The embodiments disclosed herein have been provided for description and understanding of disclosed technical matters, and do not limit the scope of the embodiments. Therefore, it should be construed that the scope of the embodiments includes any change or other various embodiments based on the technical spirit of the present document.

Figure 4:
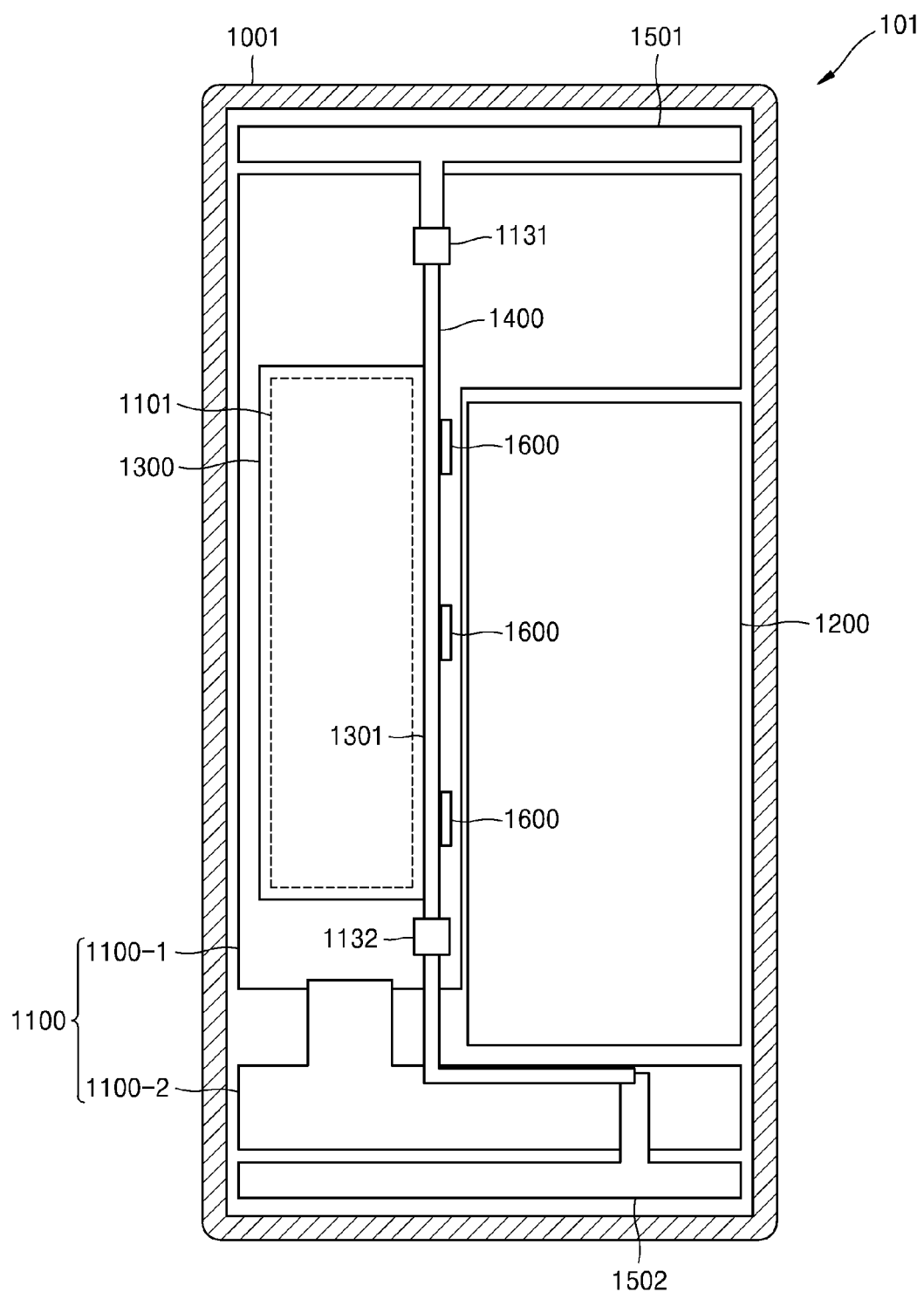
FIG. 4 is a schematic view of an electronic device according to an embodiment of the present disclosure.

FIG. 4 is a schematic view of an electronic device according to an embodiment of the present disclosure.

Referring to FIG. 4, the electronic device 101 includes a housing 1001 that forms the exterior of the electronic device 101, and a printed circuit board (PCB) 1100 included in the housing 1001. On the PCB 1100, electronic components that constitute the functional modules described above with reference to FIGS. 1 and 2 may be mounted. A battery 1200 may be electrically connected to the PCB 1100 via a connecting means. The PCB 1100 may be a single board, and may include a plurality of substrates 1100-1 and 1100-2 electrically connected to each other.

The electronic device 101 includes a conductive shield (conductive shield structure) 1300 that covers at least a partial area (a first area (mounting area)) 1101 on the PCB 1100. The conductive shield 1300 may be, for example, an electromagnetic interference (EMI) shield.

Contact units 1131 and 1132 that are spaced apart from each other are provided on the PCB 1100. The contact units 1131 and 1132 may be electrically connected to each other via a cable 1400. The contact units 1131 and 1132 may be connectors to which one end and the other end of the cable 1400 are electrically connected.

Figure 5:
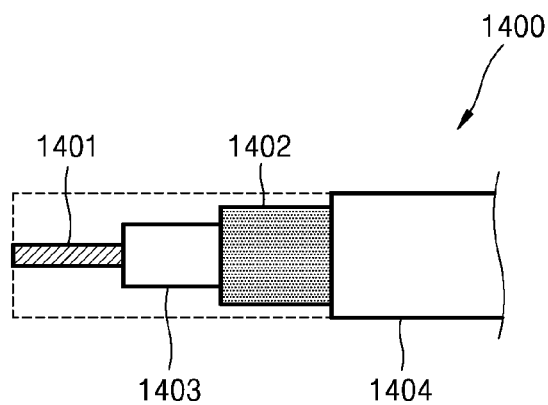
FIG. 5 is a cross-sectional view of a cable according to an embodiment of the present disclosure.

FIG. 5 is a cross-sectional view of the cable according to an embodiment of the present disclosure.

Referring to FIG. 5, the cable 1400 may be a coaxial cable including conductive lines 1401 and 1402 and insulation layers 1403 and 1404 covering the conductive lines 1401 and 1402. However, the scope of the present disclosure is not limited by this embodiment. The type of cable 1400 is not limited as long as it is an insulated or coated cable capable of electrically connecting the two contact units 1131 and 1132 to each other. At least one conductive line is included, and the number of conductive lines is not limited.

The electronic device 101 include a first antenna 1501 and a second antenna 1502 as shown in FIG. 4. For example, the first antenna 1501 may be an antenna for a cellular network, and the second antenna 1502 may be an antenna for WiFi. The first and second antennas 1501 and 1502 may be conductive antenna structures. For example, the first antenna 1501 and the second antenna 1502 may be provided on an upper end portion and a lower end portion of the electronic device 101, respectively. The cable 1400 may connect the first antenna 1501 to the second antenna 1502. One of the conductive lines 1401 and 1402 of the cable 1400 may be a ground line. One of the conductive lines 1401 and 1402 of the cable 1400 may be electrically connected to the first antenna 1501, the second antenna 1502, and the communication module 220 of FIG. 2. In FIG. 4, a signal line that connects the conductive lines 1401 and 1402 to the communication module 220 may be provided on the PCB 1100. For example, the communication module 220 of FIG. 2 may be provided on the first area 1101. The types of antennas and the number of antennas are not limited to the example of FIG. 4. For example, the electronic device 101 may further include a GPS antenna, an NFC antenna, or a Bluetooth antenna, and at least some of the antennas may be connected to the communication module 220 via the cable 1400.

A support member (support structure) 1600 for fixing the cable 1400, for example, a clip, may be provided on the PCB 1100. The support member 1600 fixes the cable 1400 in cooperation with the conductive shield 1300. As illustrated in FIG. 4, a plurality of support members 1600 may be arranged along a sidewall 1301 of the conductive shield 1300.

Figure 6:
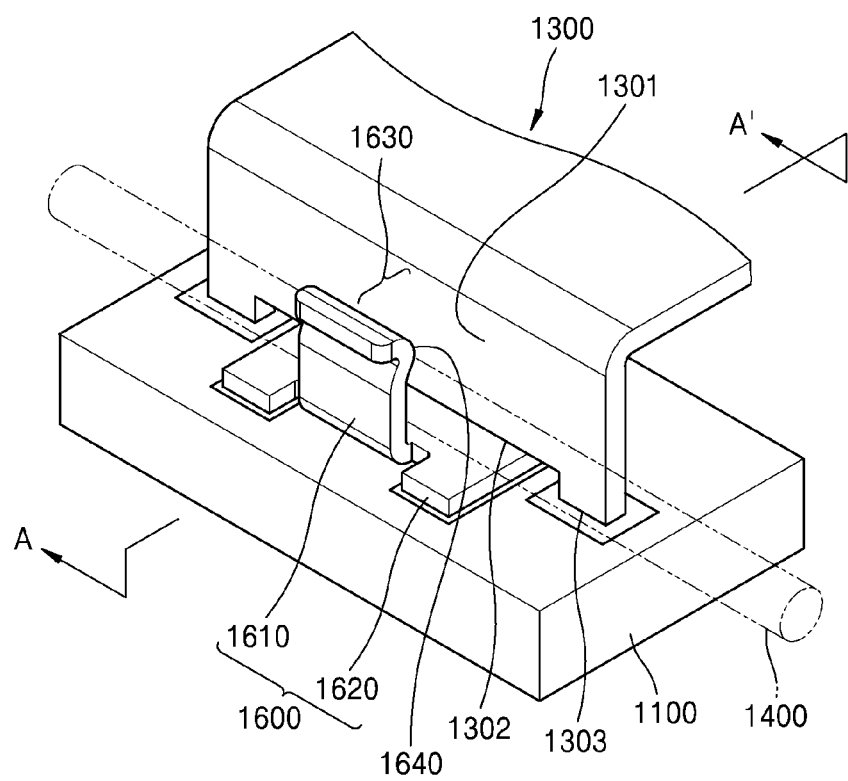
FIG. 6 is a perspective view of a structure for fixing a cable using a support member and a conductive shield, according to an embodiment of the present disclosure.

FIG. 6 is a perspective view of a structure that fixes the cable by using a support member and the conductive shield, according to an embodiment of the present disclosure.

Figure 7:
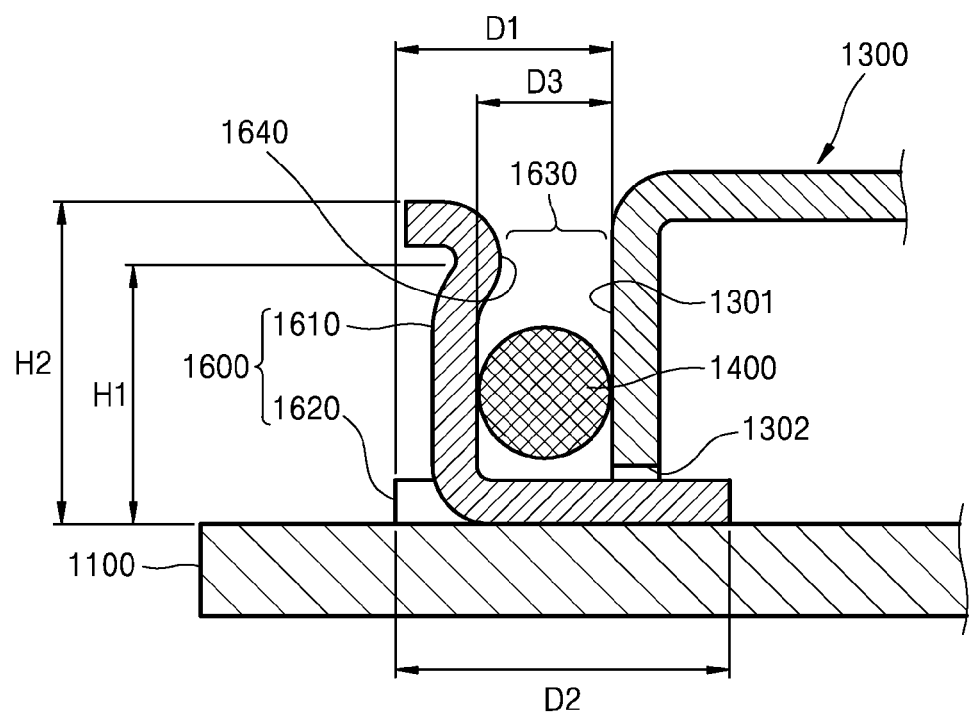
FIG. 7 is a sectional view taken along line A-A' in FIG. 6, according to an embodiment of the present disclosure.

FIG. 7 is a sectional view taken along line A-A' of FIG. 6, according to an embodiment of the present disclosure.

Referring to FIGS. 6 and 7, the support member 1600 may be mounted on the PCB 1100. The support member 1600 includes a first part 1610 that is spaced apart from a portion of one side (sidewall 1301) of the conductive shield 1300 and is parallel to the sidewall 1301, and a second part 1620 extending from the first part 1610. The first part 1610 is spaced apart from the sidewall 1301 and thus forms a fixing space 1630 into which the cable 1400 fits. A width D3 of the fixing space 1630 may be slightly less than a thickness (or diameter) of the cable 1400 such that the cable 1400 forcibly fits into the fixing space 1630. In consideration of the thickness (or diameter) of the cable 1400, a height of the first part 1610 may be determined so that the cable 1400 is fixed vertically. For example, the first part 1610 includes a fixing portion 1640 indented toward the fixing space 1630, in order to fix the cable 1400 in a vertical direction. A height H1 of the fixing portion 1640 from the PCB 1100 may be, for example, about 0.9 mm. In this case, a height H2 of the first part 1610 from the PCB 1100 may be, for example, about 1.1 mm. The height H1 of the fixing portion 1640 and the height H2 of the first part 1610 are examples, and thus the scope of the present disclosure is not limited by the above numerical values.

A horizontal movement of the cable 1400 may be prevented by the first part 1610 of the support members 1600 and the sidewall 1301 of the conductive shield 1300. The cable 1400 extends along one side, namely, the sidewall 1301, of the conductive shield 1300 while being fit between the sidewall 1301 of the conductive shield 1300 and the first part 1610 of the support member 1600.

The support member 1600 may be surface-mounted on the PCB 1100. An installation strength of the support member 1600 with respect to the PCB 1100 depends on the area of the second part 1620. Accordingly, as the second part 1620 has a wider area, the installation strength of the support member 1600 increases and thus the cable 1400 may be more stably supported. In addition, an area in which an automated equipment for surface mounting placement is able to pick up the support member 1600 is required for the surface mounting, and the area may be provided by the second part 1620.

Referring to FIGS. 6 and 7, the second part 1620 extends from the first part 1610 and further extends to the inside of the conductive shield 1300 beyond the sidewall 1301 of the conductive shield 1300. To this end, an aperture 1302 through which the second part 1620 passes may be formed in the sidewall 1301 of the conductive shield 1300. The aperture 1302 is indented upwards from an edge 1303 of the sidewall 1301 that faces the PCB 1100, namely, in a direction away from the PCB 1100. According to this configuration, the area of the second part 1620 may be increased without increasing a distance D1 from the conductive shield 1300. In other words, while the distance from the conductive shield 1300 is maintained to be D1, an installation width D2 may be greater than the distance D1.

Figure 8:
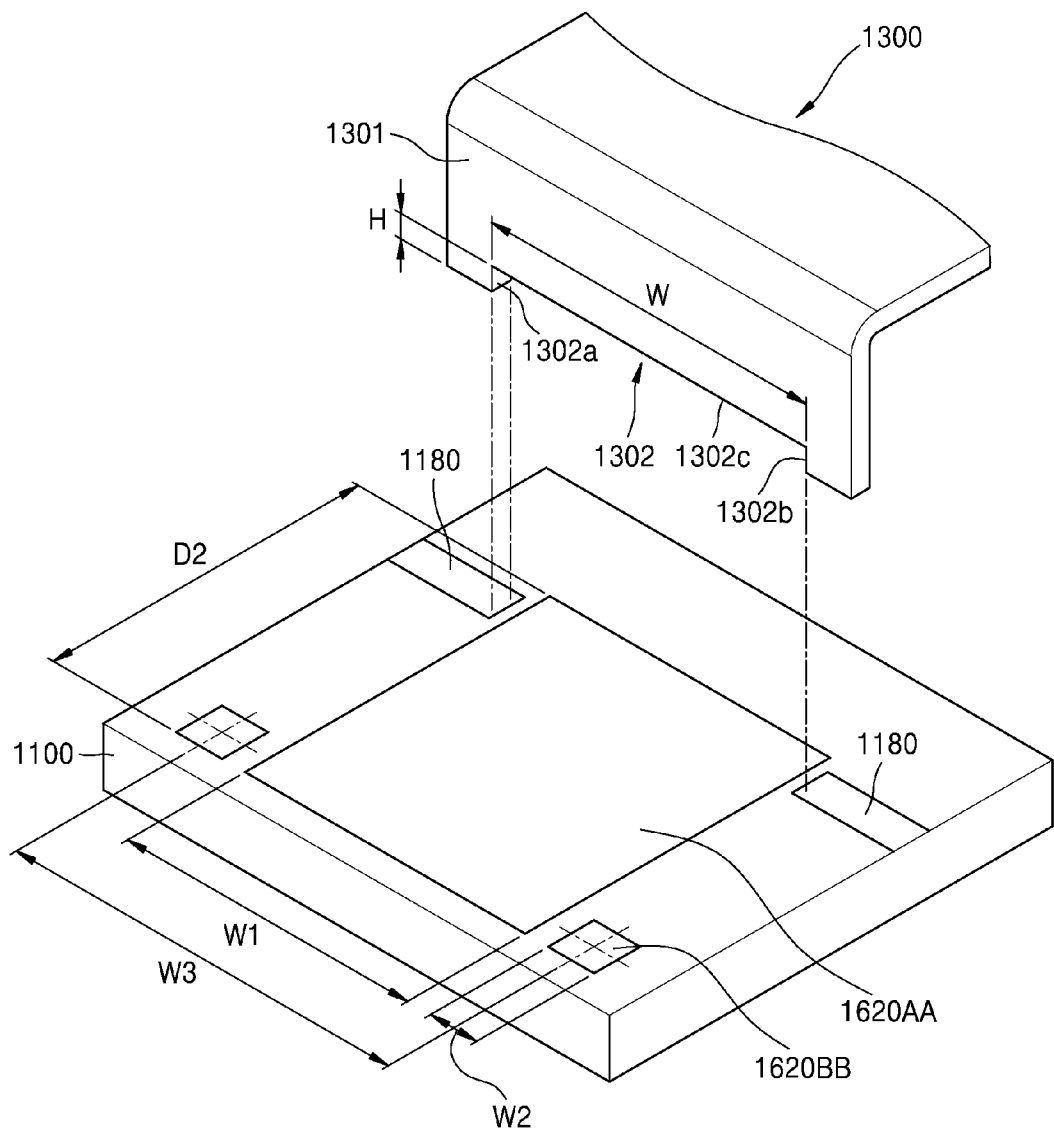
FIG. 8 is a perspective view illustrating an aperture of a conductive shield, according to an embodiment of the present disclosure.

FIG. 8 is a perspective view illustrating a size of the aperture of the conductive shield, according to an embodiment of the present disclosure.

Referring to FIG. 8, a width W of the aperture 1302 is determined in consideration of, for example, a width of the second part 1620 of the support member 1600, prevention of a contact between mounting pads 1180 provided on the PCB 1100 to mount the conductive shield 1300 and the second part 1620 of the support member 1600, and placement precision of a surface mounting process. For example, the second part 1620 of the support member 1600 may be spaced apart from each of the mounting pads 1180 by 0.3 mm or greater. Because the mounting pads 1180 extend up to edges 1302a and 1302b of the aperture 1302 in a width direction of the aperture 1302, the second part 1620 of the support member 1600 may be spaced apart from each of the edges 1302a and 1302b of the aperture 1302 by 0.3 mm or greater. An edge 1302c (of the aperture 1302 in a height direction of the aperture 1302 may be spaced apart from the second part 1620 of the support member 1600 by 0.25 mm or greater.

In FIG. 8, reference numerals 1620AA and 1620BB indicate mounting pads on which the second part 1620 is mounted. For example, reference numeral 1620AA indicates a mounting pad for a portion of the second part 1620 that is inserted into the aperture 1302, and reference numeral 1620BB indicates a pair of mounting pads for a portion of the second part 1620 that is present outside the conductive shield 1300. For example, a width W1 of the mounting pad 1620AA may be 1.1 mm, a depth D2 thereof may be 1.2 mm, and a width W2 of each of the mounting pads 1620BB may be 0.55 mm. The mounting pads 1620BB may be located on both sides of the mounting pad 1620AA and may be spaced apart from each other by 4.05 mm. In such an exemplary structure, if the second part 1620 has a thickness of 0.15 mm, the width W of the aperture 1302 is 1.7 mm (=1.1 mm (width W1 of the mounting pad 1620AA)+0.3 mm+0.3 mm) or greater, and the height H thereof is 0.4 mm (=0.15 mm (thickness of the second part 1620)+0.25 mm) or greater. The width W and the height H of the aperture 1302 are examples, and the scope of the present disclosure is not limited by the above numerical values.

Figure 9:
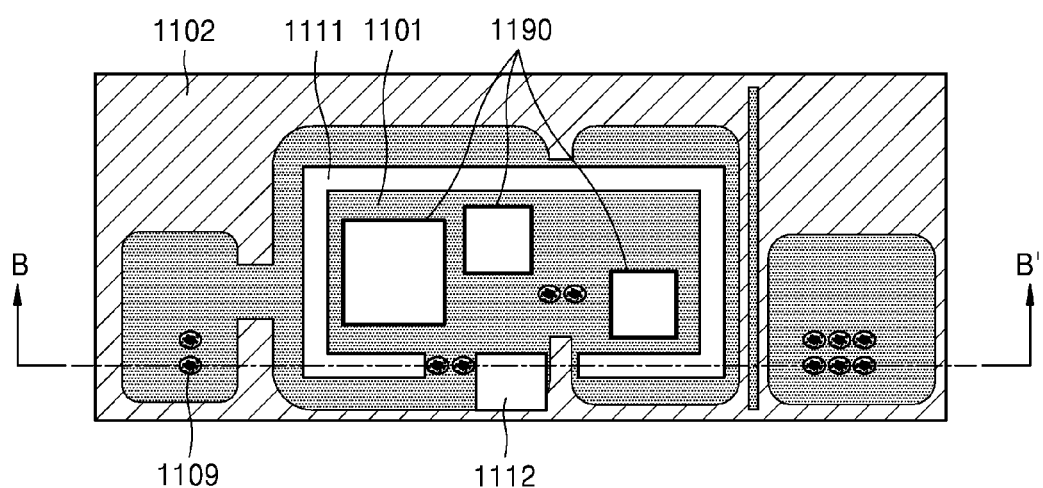
FIG. 9 is a partial plan view of a mounting area of a printed circuit board (PCB), according to an embodiment of the present disclosure.

FIG. 9 is a partial plan view of the first area of the PCB, according to an embodiment of the present disclosure.

Figure 10:
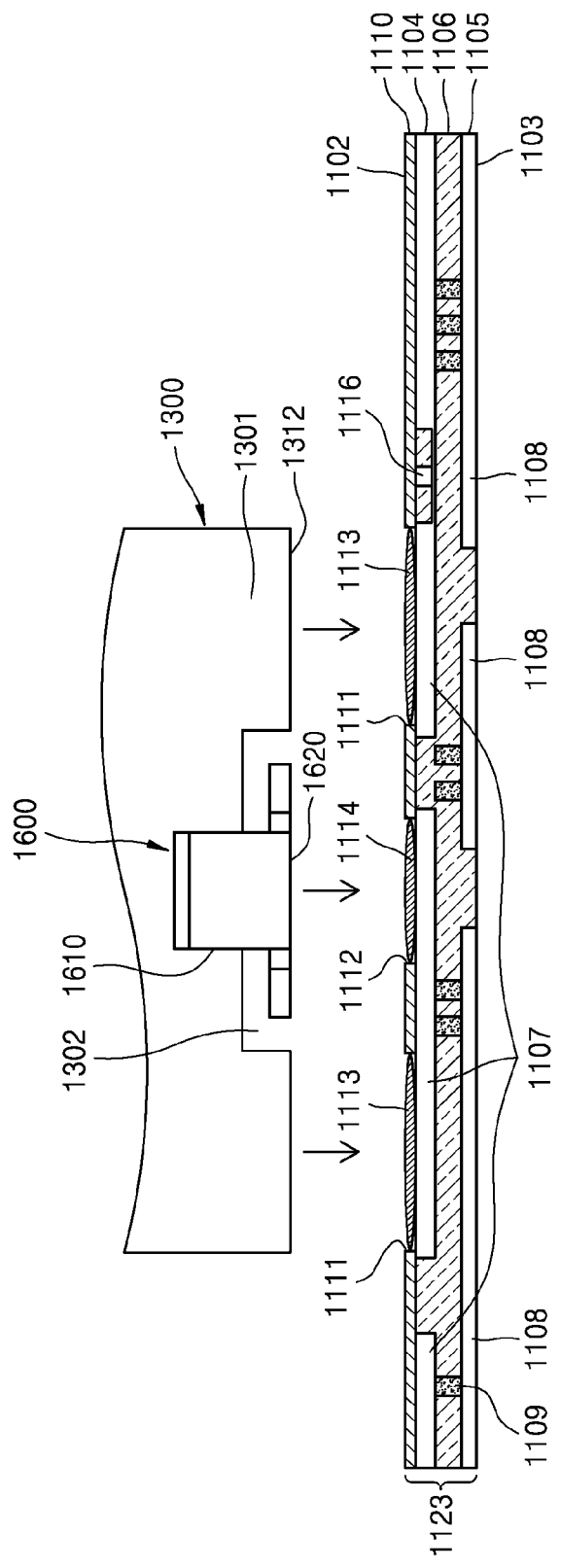
FIG. 10 is a cross-sectional view taken along line B-B' in FIG. 9, according to an embodiment of the present disclosure.

FIG. 10 is a cross-sectional view taken along line B-B' in FIG. 9, according to an embodiment of the present disclosure.

Referring to FIGS. 9 and 10, the PCB 1100 includes a first surface 1102, a second surface 1103, which is opposite the first surface 1102, and a lateral surface 1123 that connects the first surface 1102 to the second surface 1103. At least one conductive layer may be interposed between the first surface 1102 and the second surface 1103. According to an embodiment of the present disclosure, two conductive layers 1104 and 1105 are provided between the first surface 1102 and the second surface 1103, and an insulation layer 1106 is interposed between the conductive layers 1104 and 1105. The conductive layers 1104 and 1105 include a plurality of lands 1107 and a plurality of lands 1108, respectively, separated from each other by the insulation layer 1106. The lands 1107 and 1108 of the conductive layers 1104 and 1105 are electrically connected to each other by via holes 1109 and thus form an electric circuit, as necessary. The conductive layers 1104 and 1105 form a ground. The conductive layers 1104 and 1105 may also form a signal line 1116.

The first area 1101, on which electronic components 1190 are mounted, is provided on the first surface 1102. The electronic components 1190 are omitted in FIG. 10. The first surface 1102 may be implemented by an insulation layer 1110 located on an upper surface of the conductive layer 1104. The insulation layer 1110 may include a plurality of apertures via which the conductive layer 1104 is exposed. Accordingly, the first surface 1102 includes the conductive layer 1104 and a non-conductive layer (the insulation layer 1110).

The apertures include a first aperture 1111 extending along an edge of the first area 1101, and a second aperture 1112 extending from a portion of the edge of the first area 1101 to outside the first area 1101. The first aperture 1111 surrounds the first area 1101. A planar shape of the first aperture 1111 is open. The second aperture 1112 is adjacent to and spaced apart from the first aperture 1111. Although the first aperture 1111 is illustrated as a single long opening in FIG. 9, the first aperture 1111 may be implemented by a plurality of apertures arranged along the edge of the first area

1101. The first aperture 1111 may be filled with a first conductive material 1113. The second aperture 1112 may be filled with a second conductive material 1114. Accordingly, the first and second conductive materials 1113 and 1114 are electrically connected to the conductive layer 1104.

The conductive shield 1300 covers the first area 1101 and the electronic components 1190, as viewed from above the first surface 1102 of the PCB 1100. The conductive shield 1300 contacts the first conductive material 1113. For example, the conductive shield 1300 includes a mounted portion 1312 which is supported by the PCB 1100, and the mounted portion 1312 may extend from the sidewall 1301 along the first surface 1102. The mounted portion 1312 contacts the first conductive material 1113. The first conductive material 1113 may be an electrical solder material. Accordingly, the conductive shield 1300 is surface-mounted on the PCB 1100.

The support member 1600 includes the first part 1610 and the second part 1620. The first part 1610 extends substantially perpendicular to the first surface 1102 and faces a portion of the sidewall 1301 of the conductive shield 1300 at a certain distance as viewed from above the first surface 1102 of the PCB 1100. The second part 1620 extends from the first part 1610 along the first surface 1102. The support member 1600 contacts the second conductive material 1114. For example, the aperture 1302 may form a hole into which the second part 1620 is inserted, between the second aperture 1112 and a portion of the sidewall 1301. The second part 1620 of the support member 1600 is inserted into the hole (aperture 1302) formed between the sidewall 1301 and the second aperture 1112 and is seated on the second conductive material 1114 provided in the second aperture 1112. Accordingly, the support member 1600 contacts the second conductive material 1114. The second conductive material 1114 may be an electrical solder material. Accordingly, the support member 1600 may be surface-mounted on the PCB 1100.

Figure 11:
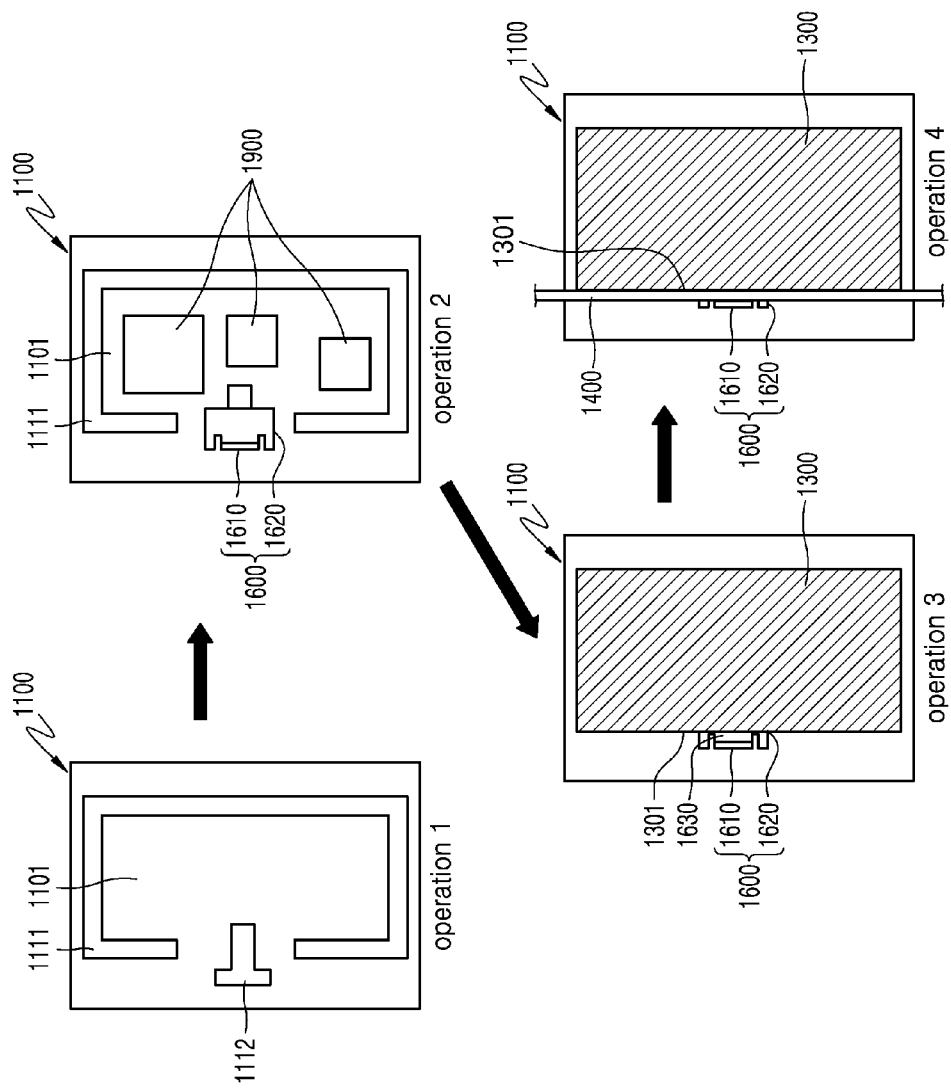
FIG. 11 schematically illustrates a surface mounting method when each of the conductive shields of FIGS. 4-7 is used, according to an embodiment of the present disclosure.

FIG. 11 schematically illustrates a surface mounting method according to an embodiment of the present disclosure.

Referring to FIG. 11, the PCB 1100 including the first and second apertures 1111 and 1112 and the first area 1101 for mounting the electronic components 1190 thereon is prepared (operation 1). A plurality of pads on which electronic components are to be mounted are provided on the first area 1101. The second aperture 1112 extends inwards from an extension of the first aperture 1111, namely, inwards toward the first area 1101. An electrical solder material may be coated on the first and second apertures 1111 and 1112 and the pads on which the electronic components 1190 are to be mounted.

The electronic components 1190 are mounted on the first area 1101, and the support member 1600 is mounted on the second aperture 1112 (operation 2).

The conductive shield 1300 is mounted on the first aperture 1111. Then, the first part 1610 of the support member 1600 and the sidewall 1301 of the conductive shield 1300 are spaced apart from each other, and thus the fixing space 1630 in which the cable 1400 is fixed is formed between the first part 1610 and the sidewall 1301. The second part 1620 of the support member 1600 extends inwards from an extension of the sidewall 1301 of the conductive shield 1300, namely, inwards towards the first area 1101 (operation 3).

The cable 1400 is fit into the fixing space 1630, and both ends of the cable 1400 are connected to the contact units 1131 and 1132, respectively. In operation 4, the cable 1400 extends along the sidewall 1301 of the conductive shield 1300 as viewed from above the first surface 1102 of the PCB 1100, and is inserted between the first part 1610 of the support member 1600 and a portion of the sidewall 1301 of the conductive shield 1300.

A plurality of mounting areas may be included. A plurality of conductive shields (conductive shield structures) that respectively cover the plurality of mounting areas may be included.

Figure 12:
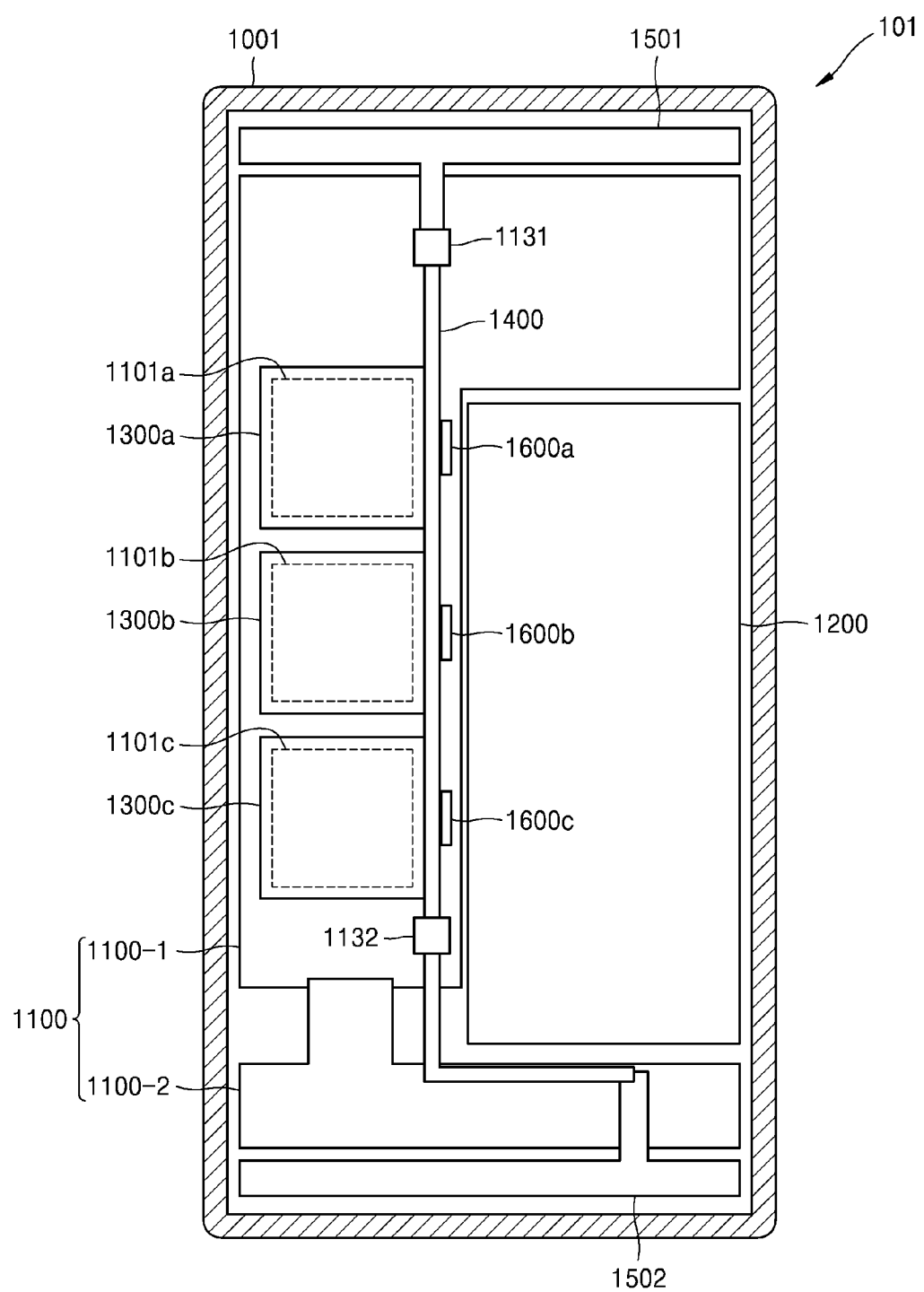
FIG. 12 is a schematic view of an electronic device according to another embodiment of the present disclosure.

FIG. 12 is a schematic view of an electronic device according to an embodiment of the present disclosure.

FIG. 12 illustrates three mounting areas, namely, first, second, and third areas 1101a, 1101b, and 1101c, and first, second, and third conductive shields 1300a, 1300b, and 1300c respectively covering the first, second, and third areas 1101a, 1101b, and 1101c. The electronic components 1190 of FIG. 9 may be mounted on the first, second, and third areas 1101a, 1101b, and 1101c, respectively. First, second, and third support members 1600a, 1600b, and 1600c may be arranged in correspondence with the first, second, and third conductive shields 1300a, 1300b, and 1300c, respectively. The shapes of the first, second, and third conductive shields 1300a, 1300b, and 1300c and a method of mounting the same on the PCB 1100 may be the same as those for the conductive shield 1300 described above with reference to FIGS. 9-11. The shapes of the first, second, and third support members 1600a, 1600b, and 1600c may be the same as that of the support member 1600 shown in FIGS. 6 and 7, and a method of mounting the first, second, and third support members 1600a, 1600b, and 1600c on the PCB 1100 may be the same as the method of mounting the support member 1600 described above with reference to FIGS. 9-11. The number of conductive shields is not limited to three. In addition, multiple support members may be arranged on a single conductive shield, and at least two supports may be arranged on a single conductive shield.

Due to the arrangement of a plurality of support members along sidewalls of a plurality of conductive shields, the cable 1400 may be stably supported.

Although an integrated conductive shield has been illustrated in the above-described embodiments, the scope of the present disclosure is not limited by these embodiments. For example, a conductive shield may be implemented by a shield frame and shield cover that is coupled or attached to the shield frame.

Figure 13:
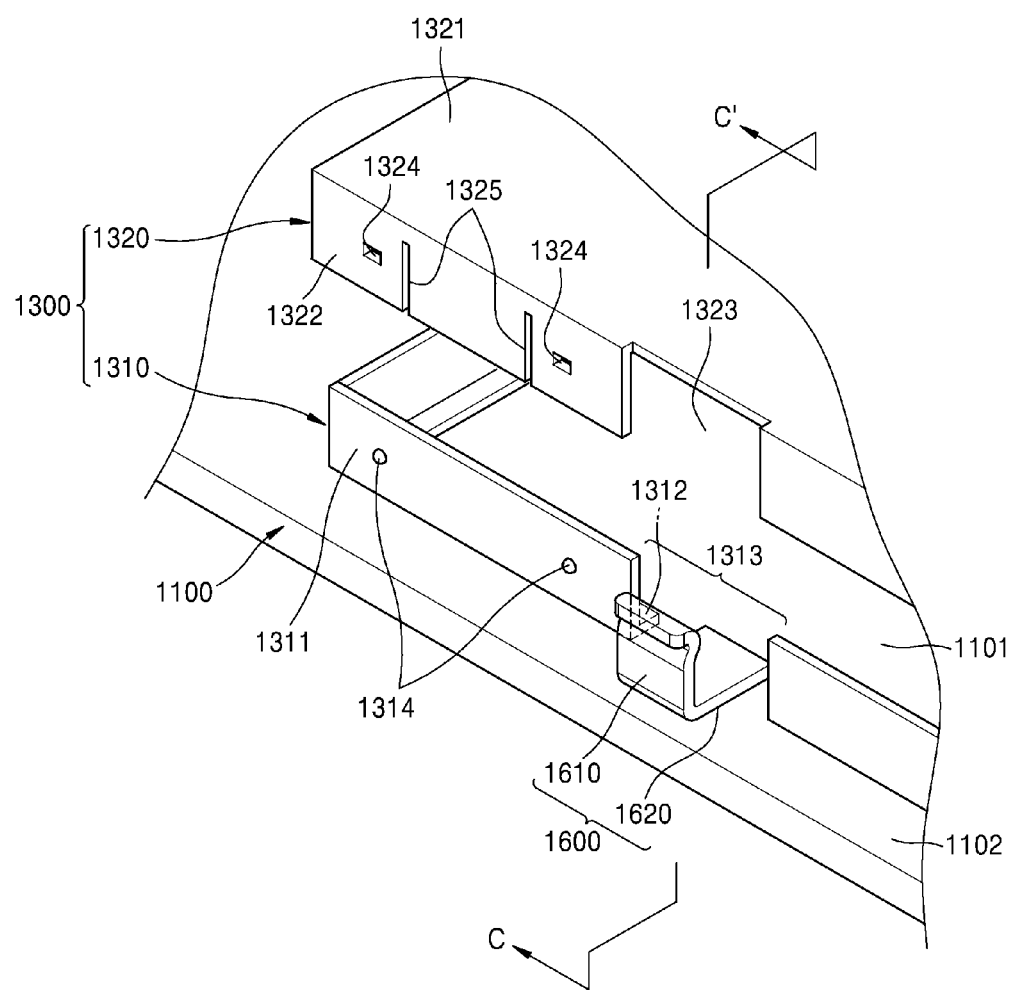
FIG. 13 is a partially exploded perspective view of a conductive shield according to an embodiment of the present disclosure.

FIG. 13 is a partially exploded perspective view of a conductive shield according to an embodiment of the present disclosure.

Referring to FIG. 13, the conductive shield 1300 includes a shield frame 1310 mounted on the PCB 1100, and a shield cover 1320 coupled to the shield frame 1310. The shield frame 1310 includes a first sidewall 1311 extending along an edge of the first area 1101 and a mounted portion 1312 extending from the first sidewall 1311 along the first surface 1102 of the PCB 1100. The mounted portion 1312 may be mounted on the first aperture 1111 of FIGS. 9 and 10 via, for example, soldering. The first sidewall 1311 may surround the first area 1101. A first aperture 1313 is formed in the first sidewall 1311 such that the second part 1620 of the support member 1600 may extend inwards an extension of the first sidewall 1311, namely, inwards the first area 1101.

The shield cover 1320 may include an upper wall 1321 covering the top of the first area 1101, and a second sidewall 1322 extending from the upper wall 1321 and covering at least a portion of the first sidewall 1311 of the shield frame

1310. A second aperture 1323 is formed at a location corresponding to the first aperture 1313 of the second sidewall 1322.

The shield cover 1320 is coupled to the shield frame 1310. For example, the shield cover 1320 may be coupled to the shield cover 1310 via a snap-fit coupling structure.

Figure 14:
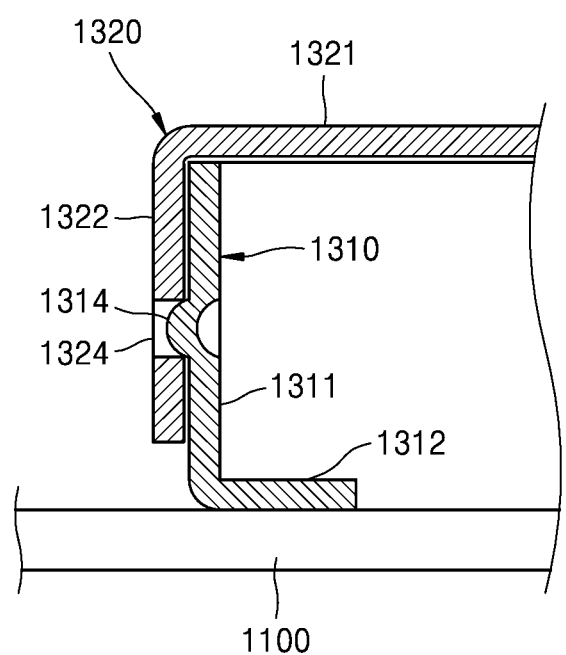
FIG. 14 is a cross-sectional view taken along line C-C' in FIG. 13, according to an embodiment of the present disclosure.

FIG. 14 is a cross-sectional view taken along line C-C' of FIG. 13, according to an embodiment of the present disclosure.

Referring to FIGS. 13 and 14, a plurality of coupling protrusions 1314 are formed on the first sidewall 1311 of the shield frame 1310. A plurality of coupling grooves 1324 are formed on the second sidewall 1322 of the shield cover 1320. When the shield cover 1320 is coupled to the shield frame 1310 from above, the second sidewall 1322 is elastically slightly opened outwards, and simultaneously the coupling protrusions 1314 are inserted into the plurality of coupling grooves 1324, and the second sidewall 1322 is elastically returned toward the first sidewall 1311. Accordingly, the shield cover 1320 is coupled to the shield frame 1310. The second sidewall 1322 includes a plurality of slits 1325 splitting the second sidewall 1322 into a plurality of areas, so that, when the shield cover 1320 is coupled to the shield frame 1310, the second sidewall 1322 is easily opened outwards. The plurality of slits 1325 are located between the plurality of coupling grooves 1324.

In FIG. 13, the aperture 1302 of FIGS. 4-11 is implemented by the first and second apertures 1313 and 1323 respectively formed in the first and second sidewalls 1311 and 1322.

The first and second apertures 1313 and 1323 completely open the first and second sidewalls 1311 and 1322 of the shield frame 1310 and the shield cover 1320. However, the scope of the present disclosure is not limited thereto.

Figure 15:
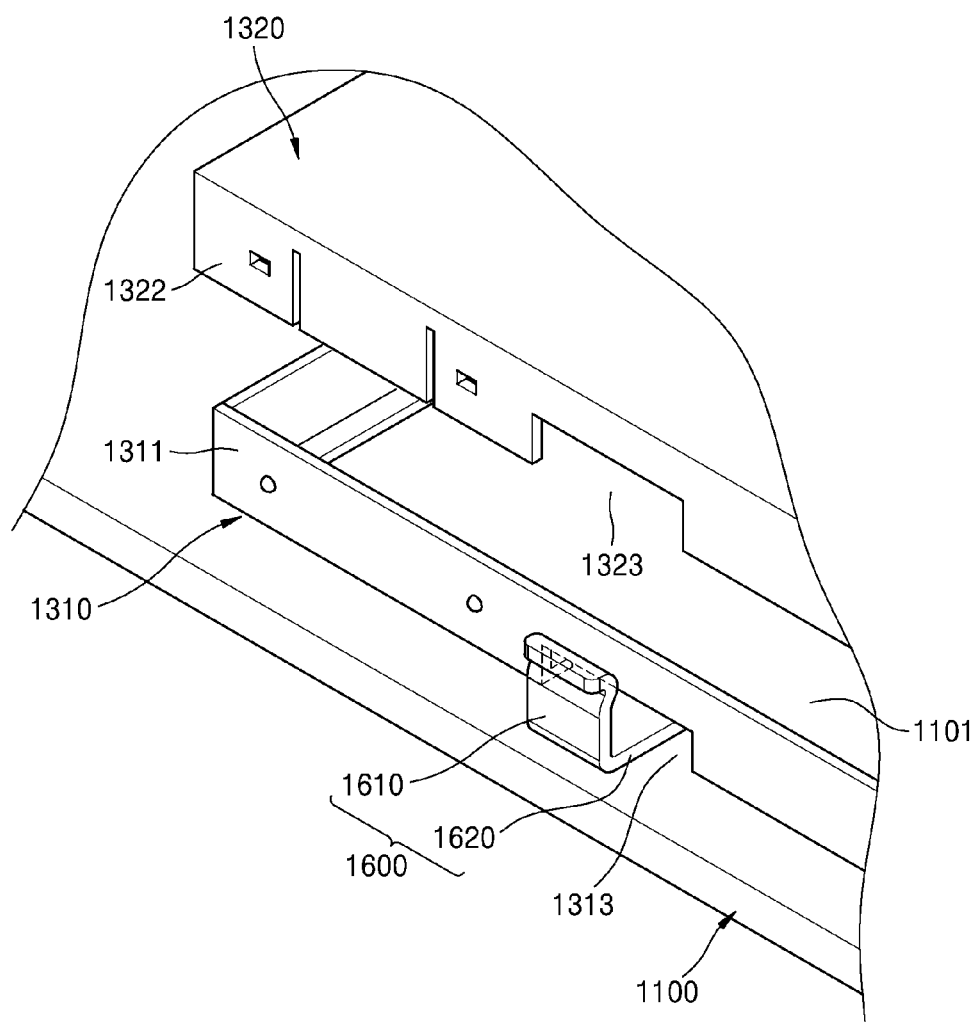
FIG. 15 is a partially exploded perspective view of a conductive shield according to an embodiment of the present disclosure.

FIG. 15 is a partially exploded perspective view of a conductive shield according to an embodiment of the present disclosure.

Referring to FIG. 15, the aperture 1302 of FIG. 6, allowing the second part 1620 of the support member 1600 to extend beyond the first and second sidewalls 1311 and 1322 and into the first area 1101, may be implemented by first and second apertures 1313 and 1323 partially indented from edges of the first and second sidewalls 1311 and 1323 facing the first surface 1102 of the PCB 1100 in an upwards direction away from the PCB 1100.

A combination of the first aperture 1313 of FIG. 13 completely opening the sidewall 1311 and the second aperture 1323 of FIG. 15 partially opening the second sidewall 1322 is possible, or a combination of the first aperture 1313 of FIG. 15 partially opening the first sidewall 1311 and the second aperture 1323 of FIG. 13 partially opening the second sidewall 1322 is possible.

A method of coupling the shield cover 1320 to the shield frame 1310 is not limited to the above-described snap-fit coupling structure. For example, the shield cover 1320 may be joined to the shield frame 1310 by screws. Alternatively, the shield cover 1320 may be joined to the shield frame 1310 via adhesion.

Figure 16:
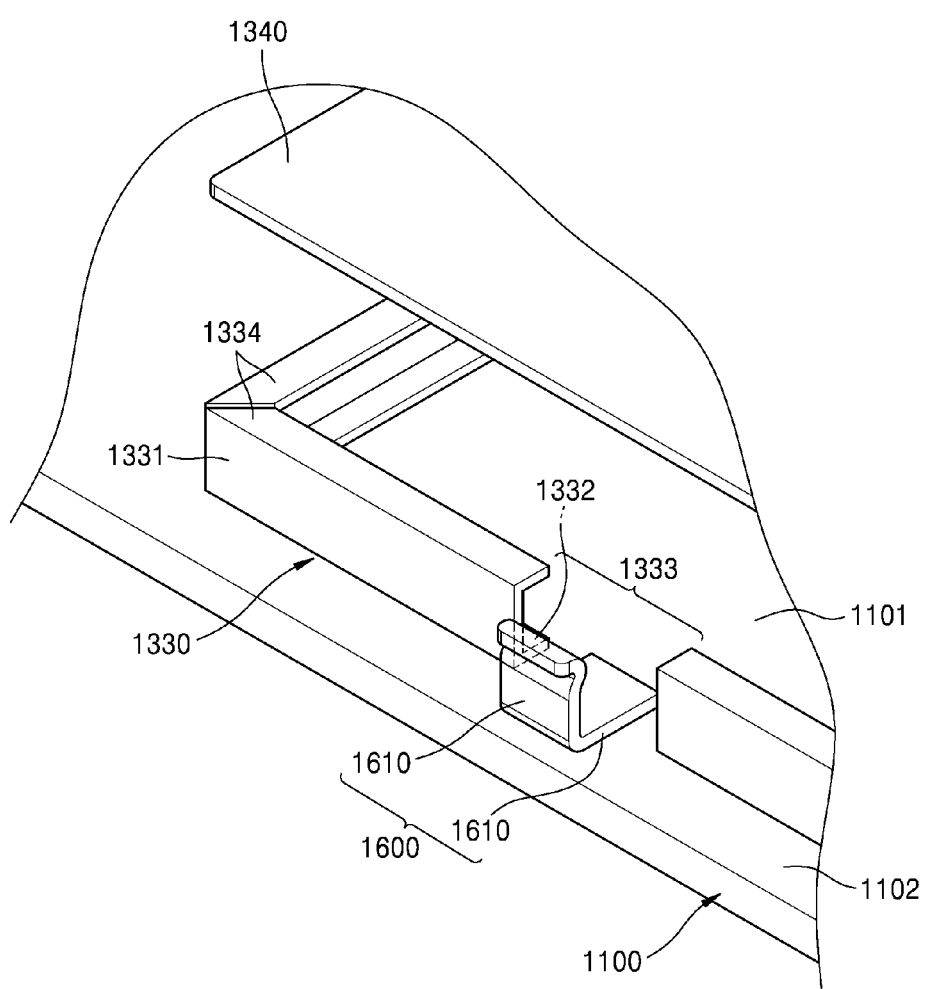
FIG. 16 is a partially exploded perspective view of a conductive shield according to another embodiment of the present disclosure.

FIG. 16 is a partially exploded perspective view of a conductive shield according to an embodiment of the present disclosure.

Referring to FIG. 16, the conductive shield 1300 includes a shield frame 1330 mounted on the PCB 1100, and a shield cover 1340 attached to the shield frame 1330. The shield frame 1330 includes a sidewall 1331 extending along an edge of the first area 1101 and a mounted portion 1332 extending from the sidewall 1331 along the first surface 1102 of the PCB 1100. The mounted portion 1332 may be mounted on the first aperture 1111 of FIGS. 9 and 10 via, for example, soldering. The sidewall 1331 surrounds the first area 1101. An aperture 1333 is formed in the sidewall 1331 such that the second part 1620 of the support member 1600 may extend beyond the sidewall 1331 inwards the first area 1101. An attachment portion 1334 is provided on an upper end of the sidewall 1331, namely, on an end of the sidewall 1331 opposite to the PCB 1100. The attachment portion 1334 denotes a surface to which the shield cover 1340 is attached.

The shield cover 1340 covers the top of the mounting area 1101. The shield cover 1340 may be attached to the attachment portion 1334 by, for example, a double-sided adhesive tape.

Figure 17:
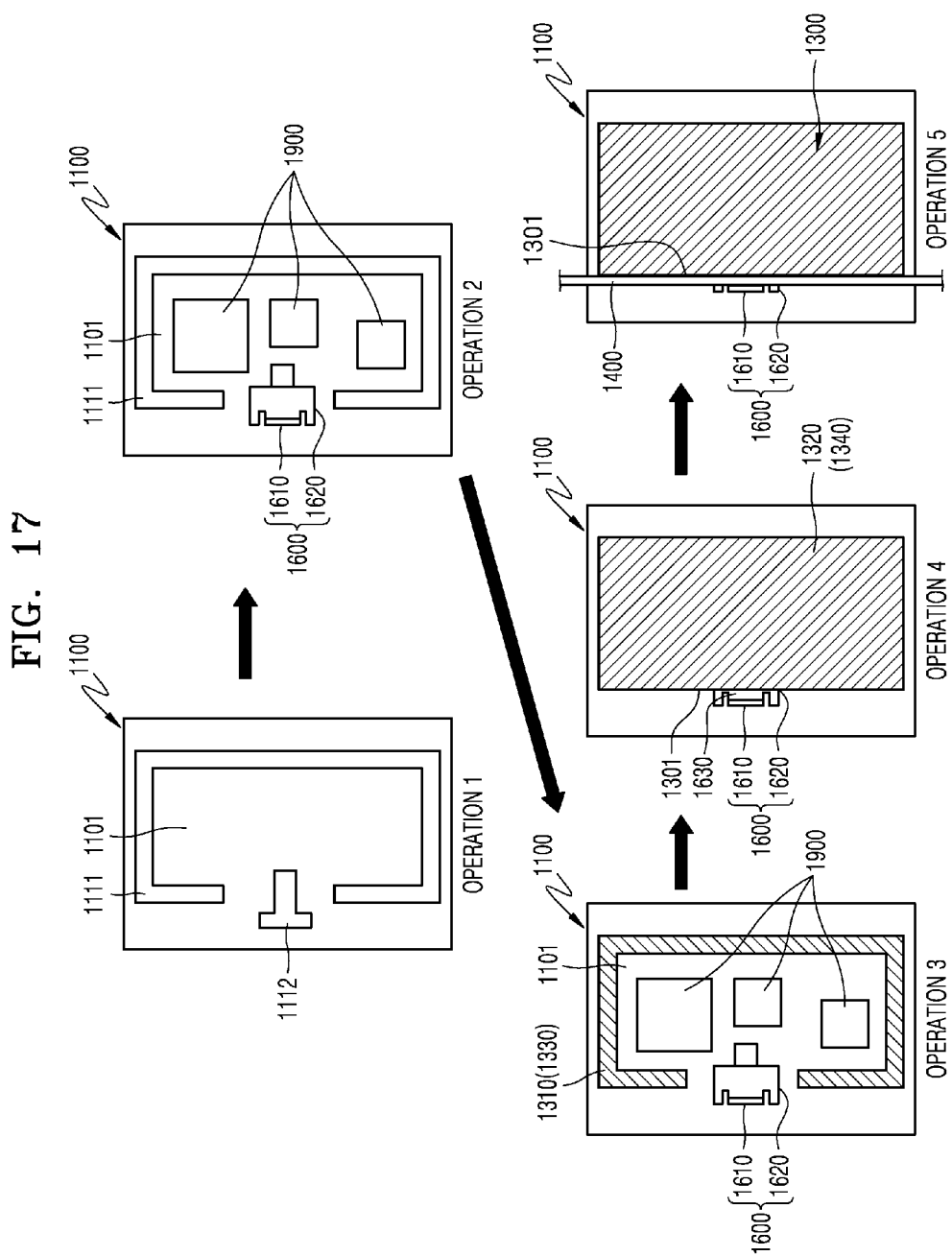
FIG. 17 schematically illustrates a surface mounting method when each of the conductive shields of FIGS. 13-16 is used, according to an embodiment of the present disclosure.

FIG. 17 schematically illustrates a surface mounting method when each of the conductive shields of FIGS. 13-16 is used, according to an embodiment of the present disclosure.

Referring to FIG. 17, the PCB 1100 including the first and second apertures 1111 and 1112 and the first area 1101 for mounting the electronic components 1190 thereon is prepared. A plurality of pads on which electronic components are to be mounted are provided on the first area 1101. The second aperture 1112 extends beyond the first aperture 1111 inwards towards the first area 1101. An electrical solder material is coated on the first and second apertures 1111 and 1112 and the pads on which the electronic components 1190 are to be mounted (operation 1).

The electronic components 1190 are mounted on the first area 1101, and the support member 1600 is mounted on the second aperture 1112 (operation 2).

The conductive shield 1300 is mounted on the first aperture 1111. To this end, the shield frame 1310 or 1330 is mounted on the first aperture 1111 (operation 3). The shield cover 1320 or 1340 is coupled or attached to the shield frame 1310 or 1330 (operation 4). Then, the first part 1610 of the support member 1600 and the sidewall 1301 of the conductive shield 1300 are spaced apart from each other, and thus the fixing space 1630 in which the cable 1400 is fixed is formed between the first part 1610 and the sidewall 1301. The second part 1620 of the support member 1600 extends beyond the sidewall 1301 of the conductive shield 1300 inwards towards the mounting area 1101.

The cable 1400 is fit into the fixing space 1630.

In a modification of the electronic device 101 of FIG. 12, a support member may be disposed on a boundary between two adjacent conductive shields.

Figure 18:
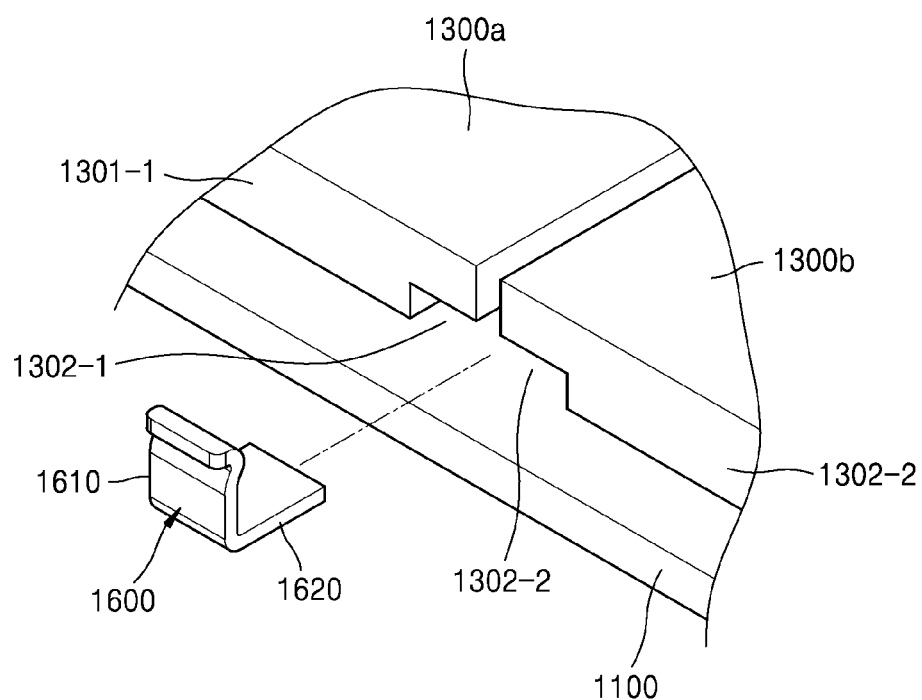
FIG. 18 is a perspective view of a structure for fixing a cable by using a support member and a conductive shield, according to an embodiment of the present disclosure.

FIG. 18 is a perspective view of a structure for fixing a cable by using a support member and a conductive shield, according to an embodiment of the present disclosure.

Referring to FIG. 18, two adjacent conductive shields, namely, the first and second conductive shields 1300*a* and 1300*b*, are mounted on the PCB 1100. The first and second conductive shields 1300*a* and 1300*b* respectively cover the first and second areas 1101*a* and 1101*b* of FIG. 12, on which the electronic components 1190 of FIG. 9 are mounted. The first part 1610 of the support member 1600 is arranged apart from portions of respective arranged sides of the first and second conductive shields 1300*a* and 1300*b*, namely, sidewalls 1301-1 and 1301-2, while facing portions of the sidewalls 1301-1 and 1301-2. In this case, apertures 1302-1 and 1302-2 are formed in the sidewalls 1301-1 and 1301-2 so that the second part 1620 of the support member 1600 may extend inwards towards the first and second conductive shields 1300*a* and 1300*b*. The cable 1400 is fit between the sidewalls 1301-1 and 1301-2 and the first part 1610 and extends along the sidewalls 1301-1 and 1301-2.

The support member 1600 may be disposed on a boundary between the second and third conductive shields 1300*b* and 1300*c* in FIG. 12.

Although the support members 1600 are supported by the first surface 1102 of the PCB 1100 in the above-described embodiments, the scope of the present disclosure is not limited thereto. The support members 1600 may be supported by at least one of the first surface 1102, the second surface 1103, and the lateral surface 1123 of the PCB 1100.

Figure 19:
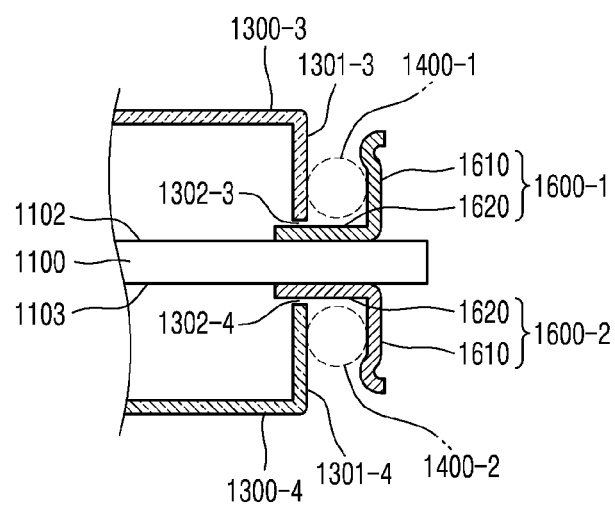
FIG. 19 is a schematic cross-sectional view of a structure for fixing a cable by using a support member and a conductive shield, according to another embodiment of the present disclosure.

FIG. 19 is a schematic cross-sectional view of a structure for fixing a cable by using a support member and a conductive shield, according to an embodiment of the present disclosure.

Referring to FIG. 19, two mounting areas for the electronic components 1190 of FIG. 9 are respectively provided on the first surface 1102 and the second surface 1103 of the PCB 1100, and the conductive shields 1300-3 and 1300-4 respectively cover the two mounting areas. Support members 1600-1 and 1600-2 are disposed on the first surface 1102 and the second surface 1103, respectively. The support members 1600-1 and 1600-2 include first parts 1610 respectively spaced apart from sidewalls 1301-3 and 1301-4. A pair of cables 1400-1 and 1400-2 are respectively disposed on the first surface 1102 and the second surface 1103 of the PCB 1100, and are respectively fixed between the sidewall 1301-3 of the conductive shield 1300-3 and the first part 1610 of the support member 1600-1 and between the sidewall 1301-4 of the conductive shield 1300-4 and the first part 1610 of the support member 1600-2. Apertures 1302-3 and 1302-4, through which the second parts 1620 of the support members 1600-1 and 1600-2 pass, are formed in the sidewalls 1301-3 and 1301-4 of the conductive shields 1300-3 and 1300-4.

Figure 20:
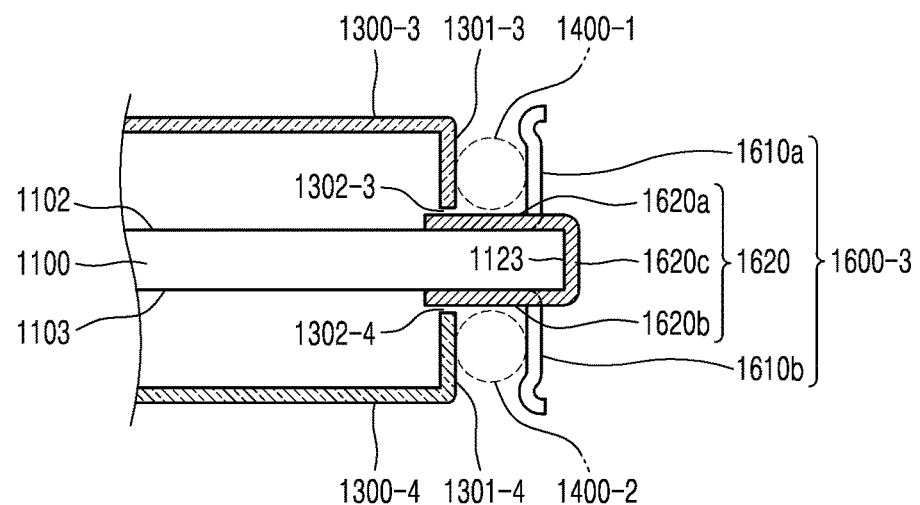
FIG. 20 is a schematic cross-sectional view of a structure for fixing a cable by using a support member and a conductive shield, according to another embodiment of the present disclosure.

FIG. 20 is a schematic cross-sectional view of a structure for fixing a cable by using a support member and a conductive shield, according to an embodiment of the present disclosure.

Referring to FIG. 20, two mounting areas for the electronic components 1190 of FIG. 9 are respectively provided on the first surface 1102 and the second surface 1103 of the PCB 1100, and the conductive shields 1300-3 and 1300-4 respectively cover the two mounting areas.

A support member 1600-3 is supported by the first surface 1102, the second surface 1103, and the lateral surface 1123 of the PCB 1100. The support member 1600-3 includes a pair of first parts 1610*a* and 1610*b* and a second part 1620 supported by the PCB 1100. The first parts 1610*a* and 1610*b* are spaced apart from the sidewalls 1301-3 and 1301-4, respectively. The second part 1620 includes portions 1620*a* and 1620*b* respectively extending from the first parts 1610*a* and 1610*b* and supported by the first surface 1102 and the second surface 1103, and a portion 1620*c* connecting the portions 1620*a* and 1620*b* and supported by the lateral surface 1123. The portion 1620*a*, the portion 1620*c*, and the portion 1620*b* form a "⊏" shape, and thus surround the first surface 1102, the lateral surface 1123, and the second surface 1103 of the PCB 1100.

The PCB 1100 is fit into the "⊏" shape formed by the portion 1620*a*, the portion 1620*c*, and the portion 1620*b*, and thus the support member 1600-3 is fixed to the PCB 1100.

The support member 1600-3 may be bonded to the PCB 1100 while the PCB 1100 is fit into the "⊏" shape formed by the portion 1620*a*, the portion 1620*c*, and the portion 1620*b*.

The support member 1600-3 is surface-mounted on the PCB 1100 while the PCB 1100 is fit into the "⊏" shape formed by the portion 1620*a*, the portion 1620*c*, and the portion 1620*b*. For example, after an electrical solder material is coated on mounting pads on the PCB 1100 and the PCB 1100 is fit into the "⊏" shape formed by the portion 1620*a*, the portion 1620*c*, and the portion 1620*b*, the resultant structure is heated and thus the second part 1620 is fixed to the mounting pads by the electrical solder material.

Apertures 1302-3 and 1302-4, through which the portions 1620*a* and 1620*b* of the support member 1600-3 pass, are respectively formed in the sidewalls 1301-3 and 1301-4 of the conductive shields 1300-3 and 1300-4. A pair of cables 1400-1 and 1400-2 are respectively disposed on the first surface 1102 and the second surface 1103 of the PCB 1100, and are respectively fixed between the sidewall 1301-3 of the conductive shield 1300-3 and the first part 1610*a* of the support members 1600-3 and between the sidewall 1301-4 of the conductive shield 1300-4 and the first part 1610*b* of the conductive shield 1600-3.

Figure 21:
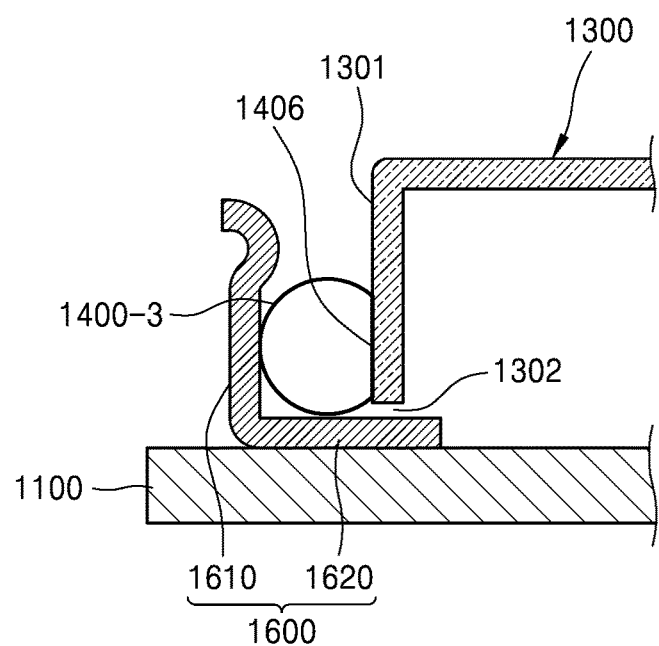
FIG. 21 is a schematic cross-sectional view of a structure for fixing a cable by using a support member and a conductive shield, according to another embodiment of the present disclosure.

FIG. 21 is a schematic cross-sectional view of a structure for fixing a cable by using a support member and a conductive shield, according to an embodiment of the present disclosure.

Referring to FIG. 21, a flat plane portion 1406 is provided on at least a portion of an outer circumference of the cable 1400. A cable 1400-3 is inserted between the first part 1610 and the sidewall 1301 such that the plane portion 1406 faces the sidewall 1301. The plane portion 1406 blocks the aperture 1302. Accordingly, at least a portion of the aperture 1302 is blocked, leading to a reduction in the amount of electromagnetic energy emitted via the aperture 1302.

Figure 22:
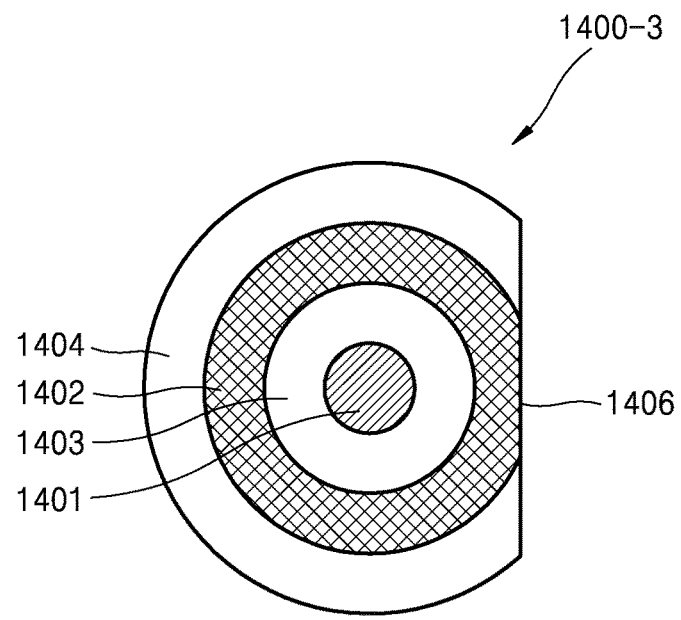
FIG. 22 is a schematic cross-sectional view of a cable according to an embodiment of the present disclosure.

FIG. 22 is a schematic cross-sectional view of a cable 1400-3 according to an embodiment of the present disclosure.

Referring to FIG. 22, an external insulation layer 1404 covering an external conductive line 1402 of the cable 1400-3 is partially removed, and thus the external conductive line 1402 is exposed via the plane portion 1406. When the cable 1400-3 is inserted between the first part 1610 and the sidewall 1301 such that the plane portion 1406 faces the sidewall 1301, a portion of the external conductive line 1402 exposed via the plane portion 1406 contacts the sidewall 1301. The external conductive line 1402 may be a ground line. Accordingly, the external conductive line 1402 is electrically connected to the conductive layers 1104 and/or 1105 of FIG. 10, which form a ground, via the sidewall 1301 and the first conductive material 1113 of FIG. 10, as necessary.

Figure 23:
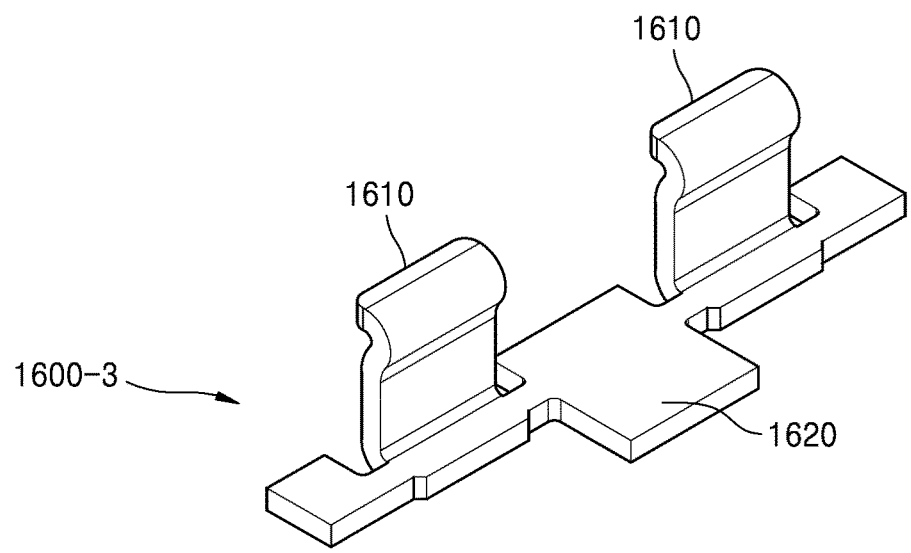
FIG. 23 is a perspective view of a support member according to an embodiment of the present disclosure.

Although each support member 1600 includes one first part 1610 and one second part 1620 in the above-described embodiments, the support member 1600 may include at least two first parts 1610. FIG. 23 is a schematically perspective view of a support 1600-4 according to an embodiment. Referring to FIG. 23, the support member 1600-4 includes two first parts 1610 and a second part 1620 connected to the two first parts 1610.

The support members 1600 of FIG. 4, at least one of the support members 1600*a*, 1600*b*, and 1600*c* of FIG. 12, and at least one of the support members 1600-1 and 1600-2 of FIG. 19 may be substituted by the support members 1600-4 of FIG. 23.

The number of first parts 1610 may be at least three. As necessary, the number of second parts 1620 may be at least two.

It should be understood that embodiments described herein should be considered in a descriptive sense only and not for purposes of limitation. Descriptions of features or aspects within each embodiment should typically be considered as available for other similar features or aspects in other embodiments.

While certain embodiments have been described with reference to the drawings, it will be understood by those of ordinary skill in the art that various changes in form and details may be made therein without departing from the spirit and scope of the present disclosure, as defined by the following claims and their equivalents.

What is claimed is:

1. An electronic device comprising:
a housing;
a printed circuit board (PCB) included in the housing, and comprising a first surface, a second surface on a side of the PCB opposite to the first surface, a lateral surface, a non-conductive layer forming at least a portion of the first surface, and a conductive layer arranged between the first surface and the second surface;
a first electronic component arranged on a first area of the first surface of the PCB;
a first conductive shield structure arranged on the PCB to cover the first area and the first electronic component on the PCB;
a support structure connected to the PCB comprising a first part that extends substantially perpendicular to the first surface and faces a portion of one side of the first conductive shield structure; and
a cable extending along the one side of the first conductive shield structure, inserted between the support structure and the portion of the one side of the first conductive shield structure, and comprising at least one conductive line and an insulation layer that covers the at least one conductive line.

2. The electronic device of claim 1, wherein the second aperture is adjacent to and spaced apart from the first aperture.

3. The electronic device of claim 1, wherein the first conductive material and the second conductive material comprise an electrical solder material.

4. The electronic device of claim 1, wherein the first conductive material and the second conductive material are electrically connected to the conductive layer.

5. The electronic device of claim 1, wherein
the first conductive shield structure comprises a sidewall, and
the support structure further comprises a second part inserted into a hole formed between the second aperture and a portion of the sidewall.

6. The electronic device of claim 1, wherein the support structure is connected to at least one of the first surface, the second surface, and the lateral surface of the PCB.

7. The electronic device of claim 1, further comprising:
a conductive antenna structure; and
a wireless communication circuit,
wherein the at least one conductive line is electrically connected to the conductive antenna structure and the wireless communication circuit.

8. The electronic device of claim 1, further comprising:
a second electronic component arranged on a second area of the first surface of the PCB that is adjacent to the first area; and
a second conductive shield structure arranged on the PCB to cover the second area and the second electronic component on the PCB,
wherein the first part of the support structure faces a portion of one side of the second conductive shield structure.

9. An electronic device comprising:
a housing;
a printed circuit board (PCB) included in the housing, and comprising a first surface, a second surface opposite to the first surface, a lateral surface, a non-conductive layer forming at least a portion of the first surface, and a conductive layer arranged between the first surface and the second surface;
an electronic component arranged on a first area and a second area of the first surface of the PCB, wherein the first area and the second area are arranged side by side;
first and second conductive shield structures arranged on the PCB to respectively cover the first area and the second area on the PCB;
a support structure connected to the PCB, and comprising a first part that extends substantially perpendicular to the first surface and faces portions of respective arranged sides of the first and second conductive shields; and
a cable extending along the arranged sides of the first and second conductive shield structures, inserted between the support structure and the portions of the arranged sides of the first and second conductive shield structures, and comprising at least one conductive line and an insulation layer that covers the at least one conductive line.

10. An electronic device comprising:
a housing;
a printed circuit board (PCB) included in the housing and comprising a mounting area on which an electronic component is mounted, and a pair of contact units;
a conductive shield mounted on the PCB to cover the mounting area and comprising a sidewall and an aperture that partially opens the sidewall;
a support member comprising a first part spaced apart from the sidewall and mounted on the PCB; and
a cable configured to electrically connect the pair of contact units to each other and to be inserted between the sidewall and the first part.

11. The electronic device of claim 10, wherein
the cable comprises a plane portion that is flat and faces the sidewall, and
the plane portion covers at least a portion of the aperture.

12. The electronic device of claim 11, wherein
the cable comprises a conductive line and an insulation layer that covers the conductive line, and
the conductive line is exposed and contacts the sidewall.

13. The electronic device of claim 1, wherein
the mounting area comprises a plurality of mounting areas,
the conductive shield comprises a plurality of conductive shields that respectively cover the plurality of mounting areas, and
the support member comprises a plurality of support members respectively corresponding to the plurality of conductive shields.

14. The electronic device of claim 1, wherein
the mounting area comprises a plurality of mounting areas,
the conductive shield comprises a plurality of conductive shields that respectively cover the plurality of mounting areas, the support member is arranged to partially face each of respective arranged sidewalls of two adjacent conductive shields among the plurality of conductive shields, and the aperture is formed in each of the two adjacent conductive shields.

15. The electronic device of claim 1, wherein the conductive shield comprises a shield frame that surrounds the mounting area and is surface-mounted on the PCB, and a shield cover that is coupled to the shield frame and covers the mounting area.

16. The electronic device of claim 15, wherein the shield frame comprises a first sidewall that surrounds the mounting area, the shield cover comprises a cover portion that covers the mounting area, and a second sidewall that extends from the cover portion, and a first aperture and a second aperture are respectively provided in the first sidewall and the second sidewall.

17. The electronic device of claim 16, wherein the shield cover is coupled to the shield frame according to a snap-fit coupling structure.

18. The electronic device of claim 17, wherein a plurality of coupling protrusions are provided on the first sidewall, and a plurality of coupling grooves, into which the plurality of coupling protrusions are inserted, are provided on the second sidewall.

19. The electronic device of claim 18, wherein slits that split the second sidewall into a plurality of areas are provided between the plurality of coupling grooves of the second sidewall.

20. The electronic device of claim 15, wherein the shield frame comprises a first sidewall that surrounds the mounting area, and an attachment portion provided on an upper end of the first sidewall, and the shield cover contacts the attachment portion.

21. The electronic device of claim 20, wherein the aperture is in the first sidewall.

22. The electronic device of claim 10, further comprising:

a conductive antenna;

a wireless communication module, wherein the cable electrically connects the conductive antenna to the wireless communication module.

* * * * *